United States Patent [19]
Steele et al.

[11] Patent Number: 5,530,439
[45] Date of Patent: Jun. 25, 1996

[54] DETERMINISTIC METHOD AND AN APPARATUS FOR MINIMAL SWITCH CIRCUITS

[75] Inventors: Randy C. Steele; Gregory B. Hibdon, both of Folsom; Jay J. Sturges, Orangevale; Richard P. Vireday, Cameron Park, all of Calif.

[73] Assignee: Intel Corporation, Santa Clara, Calif.

[21] Appl. No.: 312,422

[22] Filed: Sep. 26, 1994

Related U.S. Application Data

[63] Continuation of Ser. No. 825,132, Jan. 24, 1992, abandoned.

[51] Int. Cl.$^6$ ................................................... H03K 17/00
[52] U.S. Cl. .............................. 340/825.830; 340/825.79; 364/716; 326/41
[58] Field of Search .................. 340/825.79, 825.85, 340/825.86, 825.89, 825.9, 825.91, 825.83; 370/65; 364/716; 326/41, 39, 101

[56] References Cited

U.S. PATENT DOCUMENTS 5,149,993  9/1992  Kikuchi et al. ..................... 307/465.1
5,153,463 10/1992  Keiichi ............................... 340/825.83

Primary Examiner—Michael Horabik
Attorney, Agent, or Firm—Blakely, Sokoloff, Taylor & Zafman

[57] ABSTRACT

A deterministic method and apparatus for defining the size and switch assignments of a switch matrix. The method operates on a switch matrix having a number of inputs (N) and a number of outputs (M). When constructing the switch matrix, there will be M columns in the matrix. The method determines a minimum number of rows (R) for the switch matrix. The resultant general purpose R×M switch matrix allows any combination of a subset of the N inputs, with up to M members, to be assigned to the outputs. The resultant R×M switch matrix will be smaller than an N×M switch matrix.

31 Claims, 15 Drawing Sheets

FIG_1

FIG_2 (PRIOR ART)

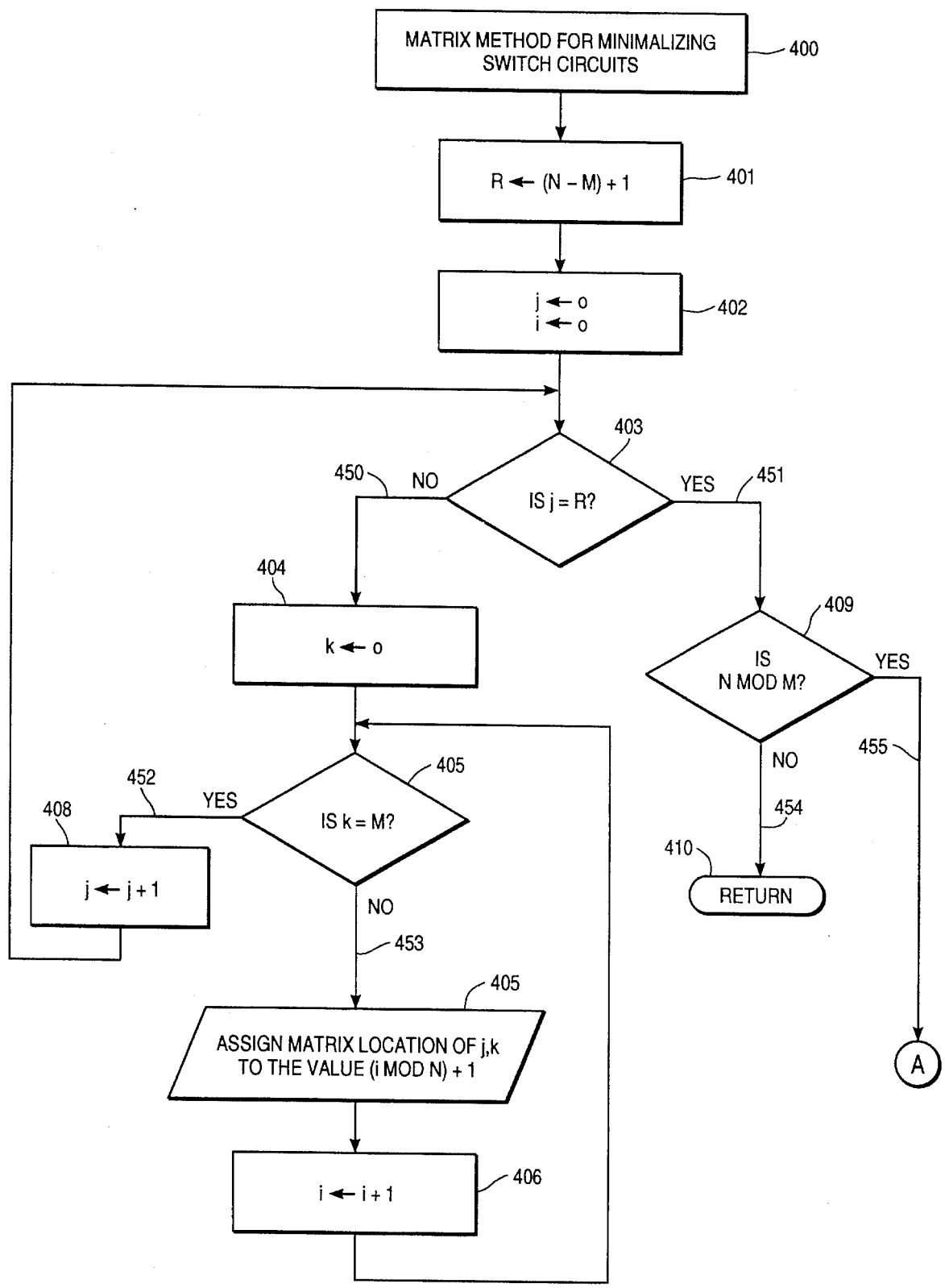
FIG_4A

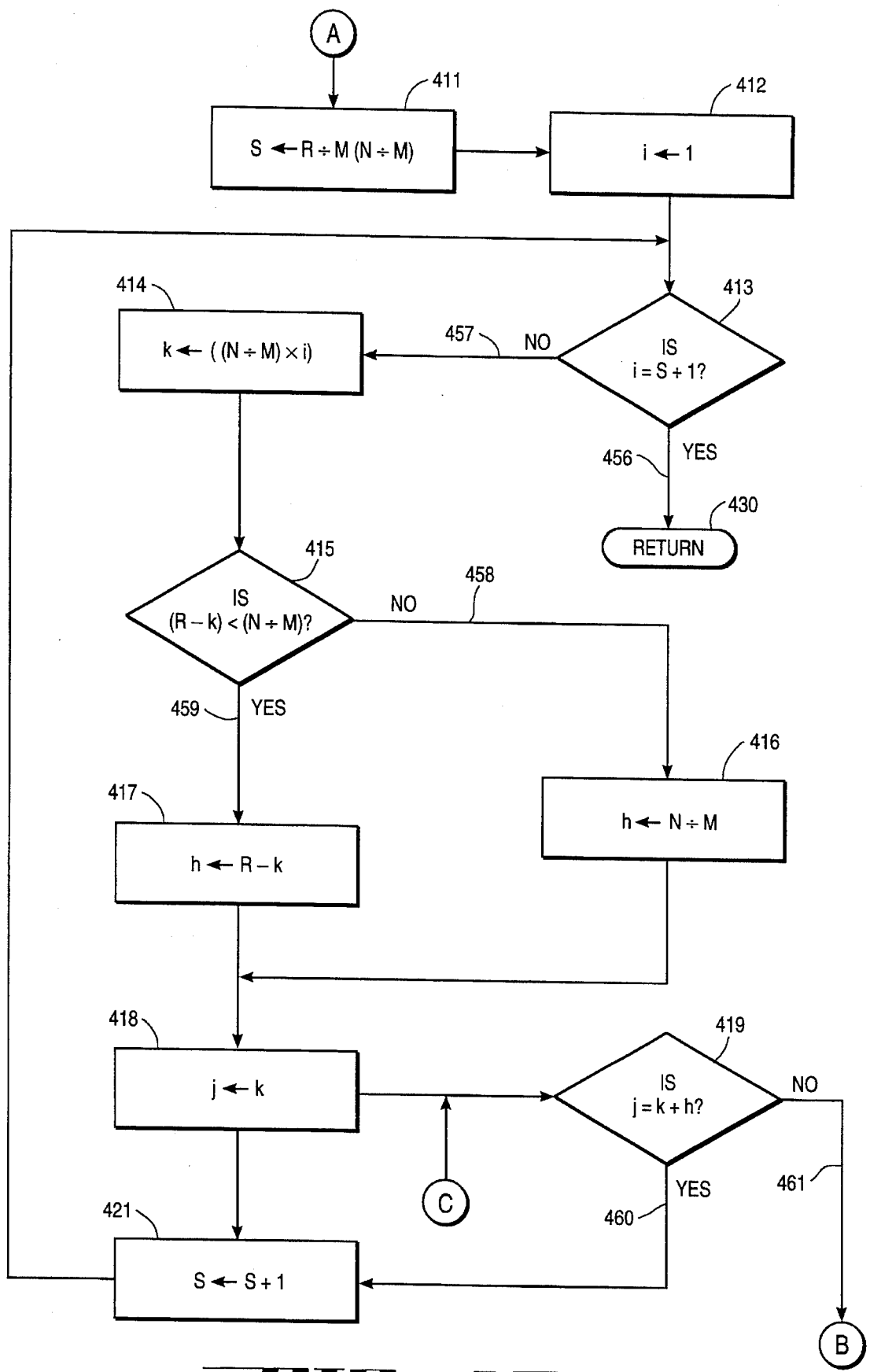
FIG_4B

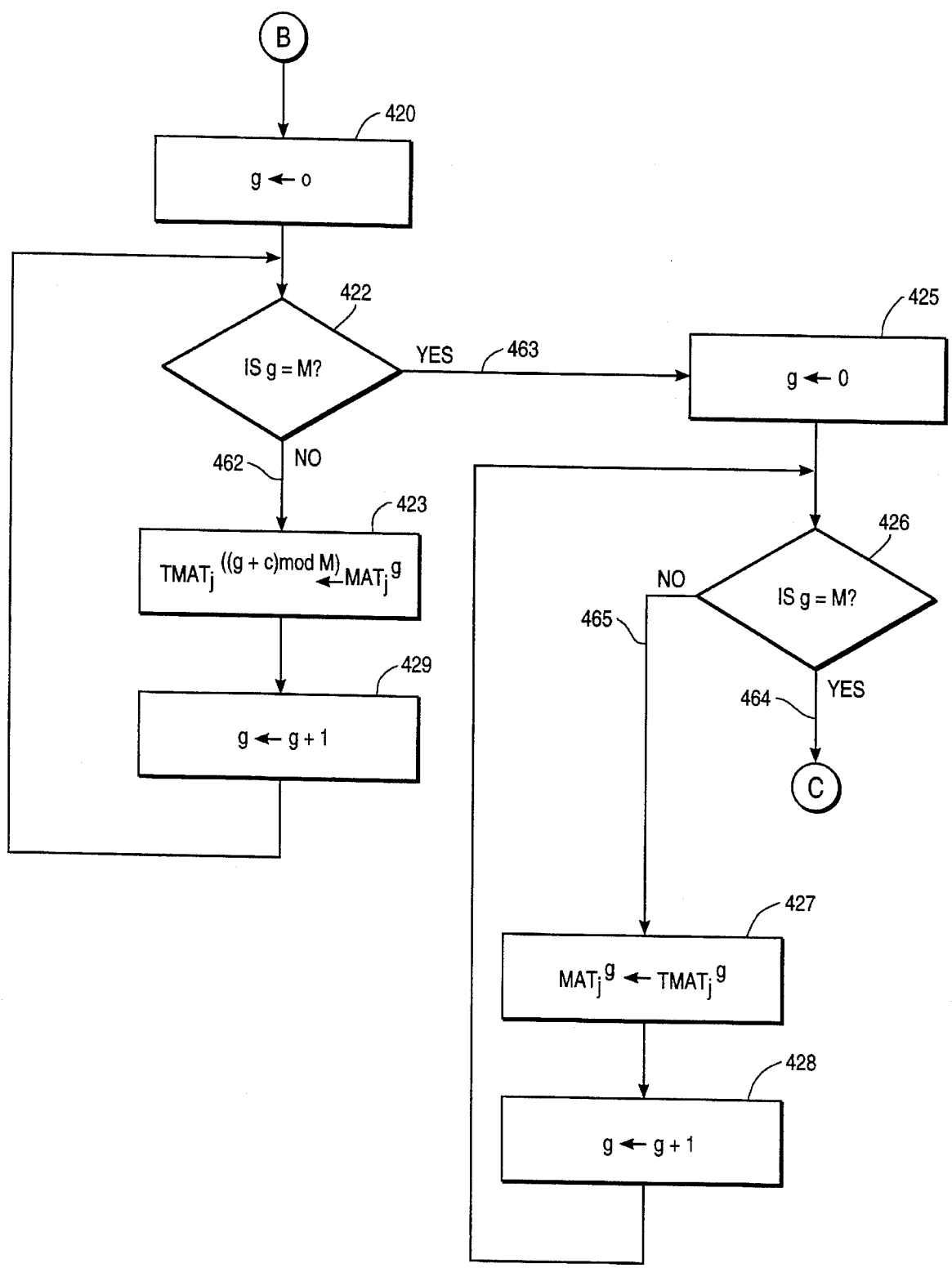
FIG_4C

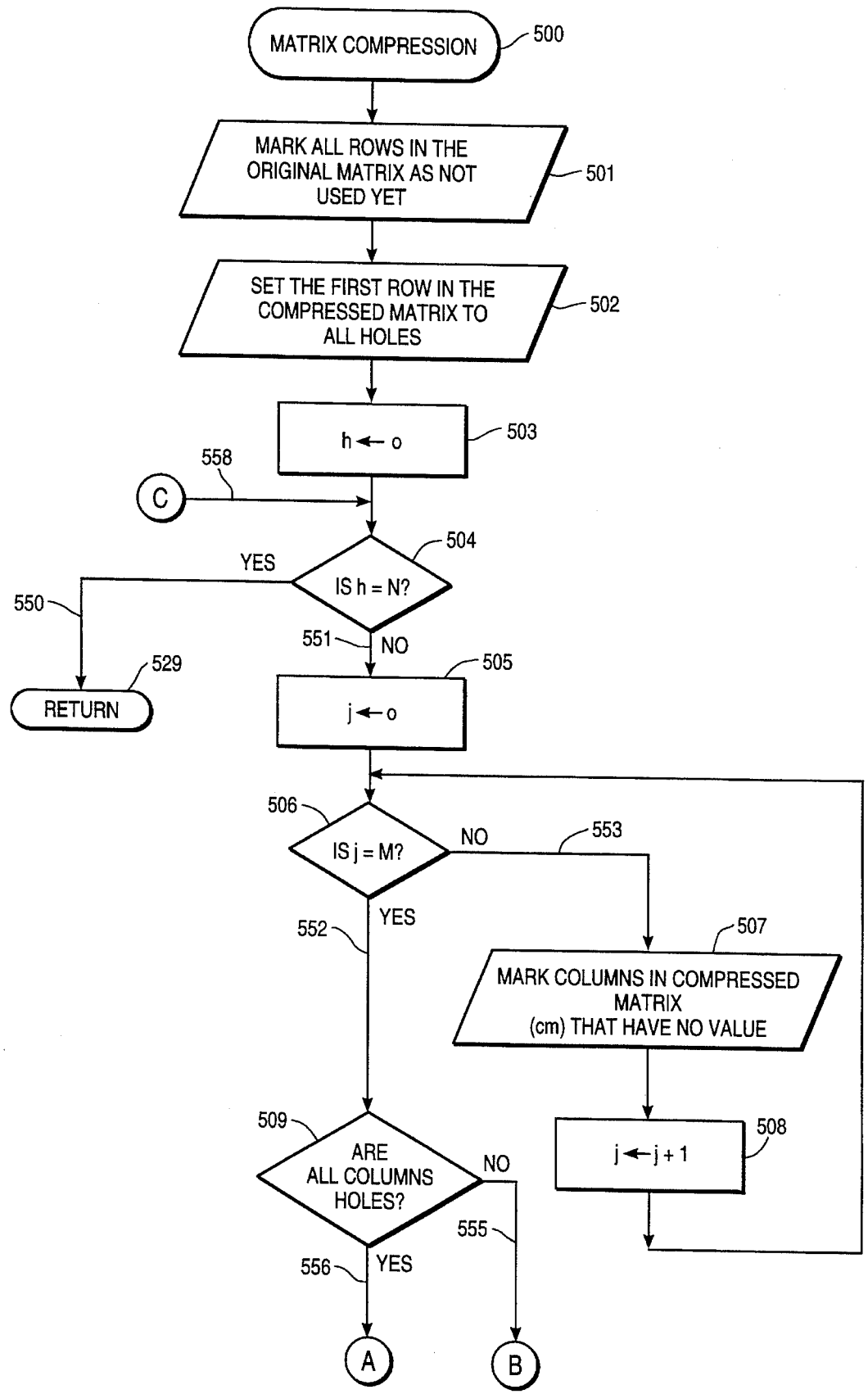
FIG_5A

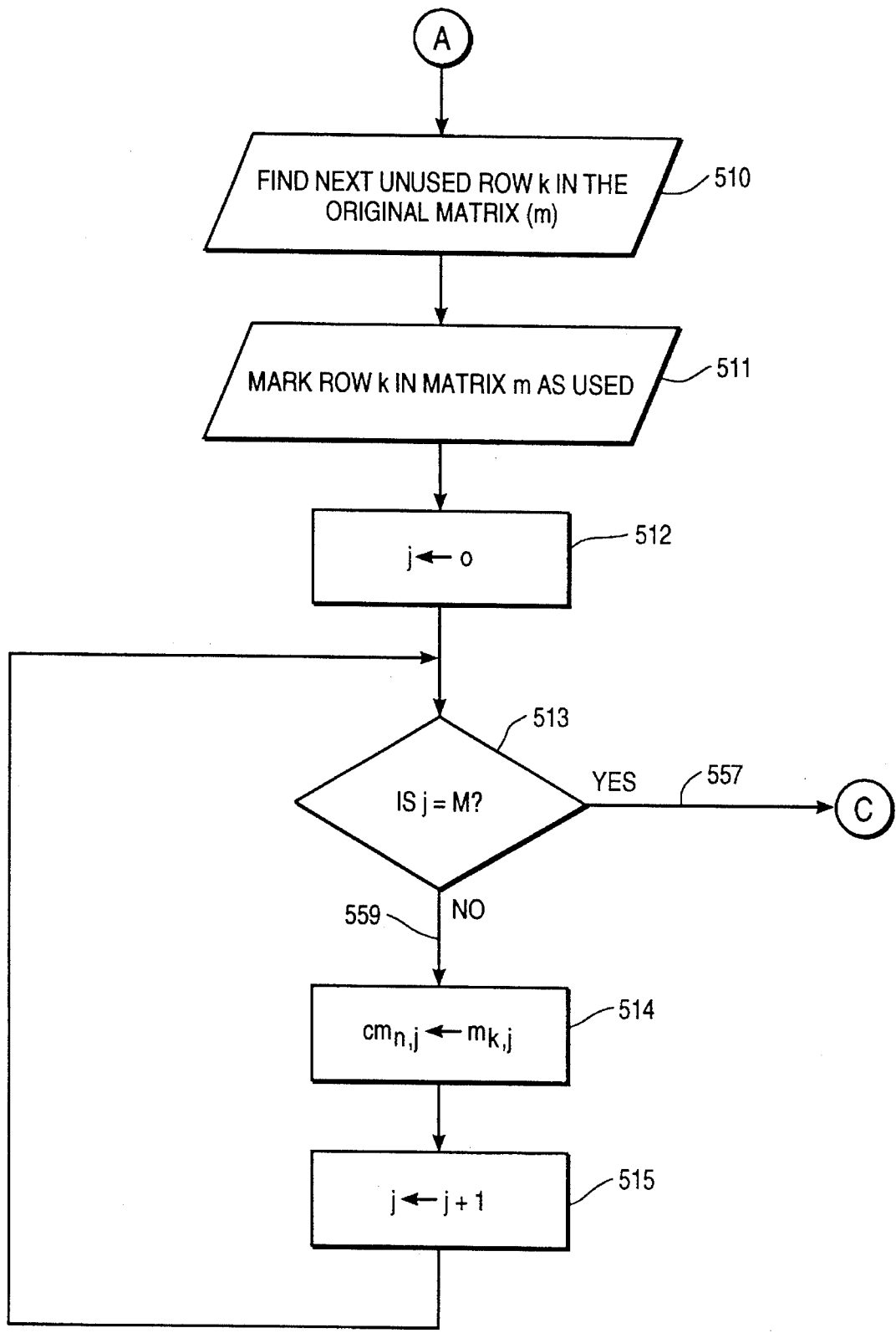
FIG_5B

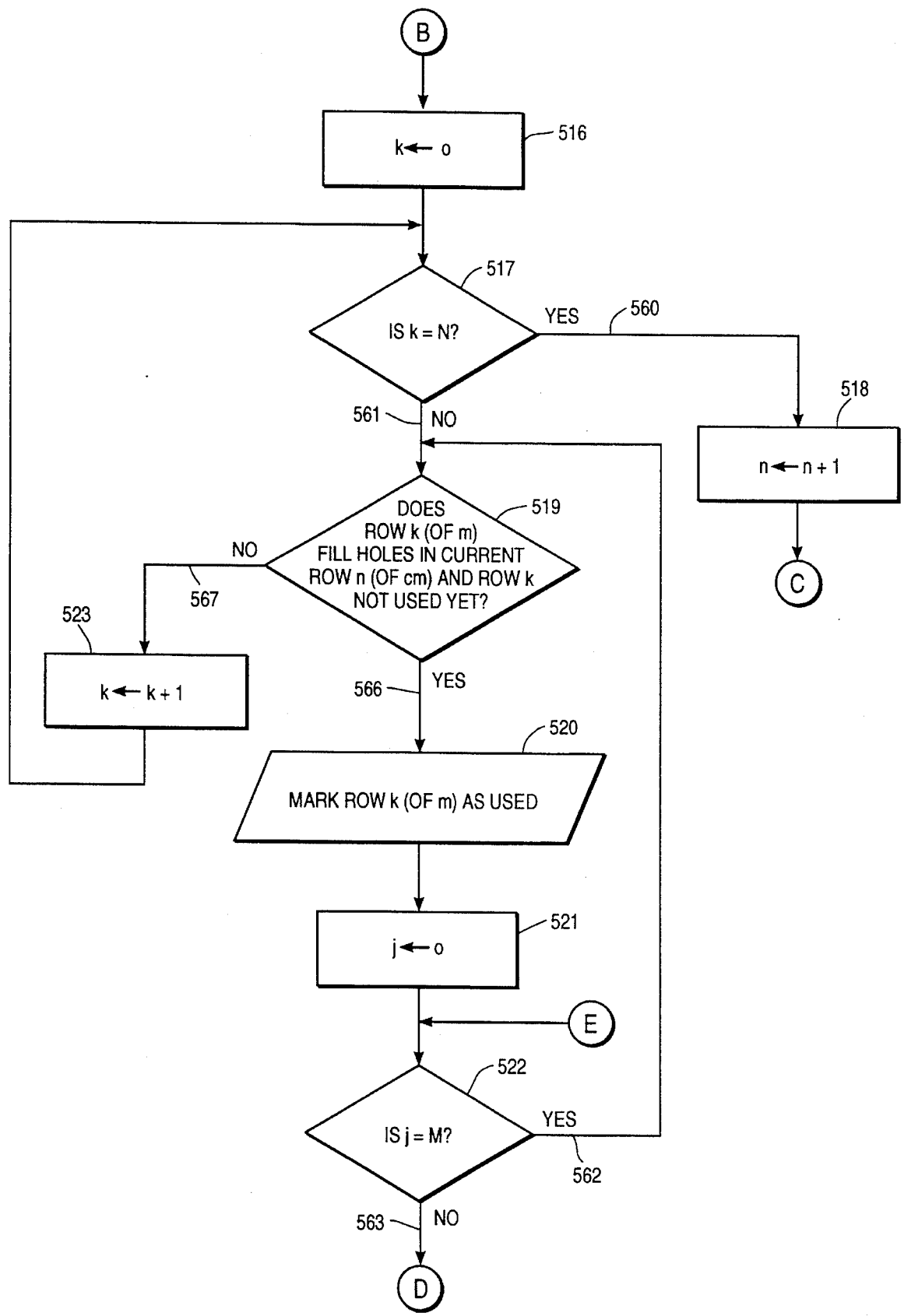
FIG_5C

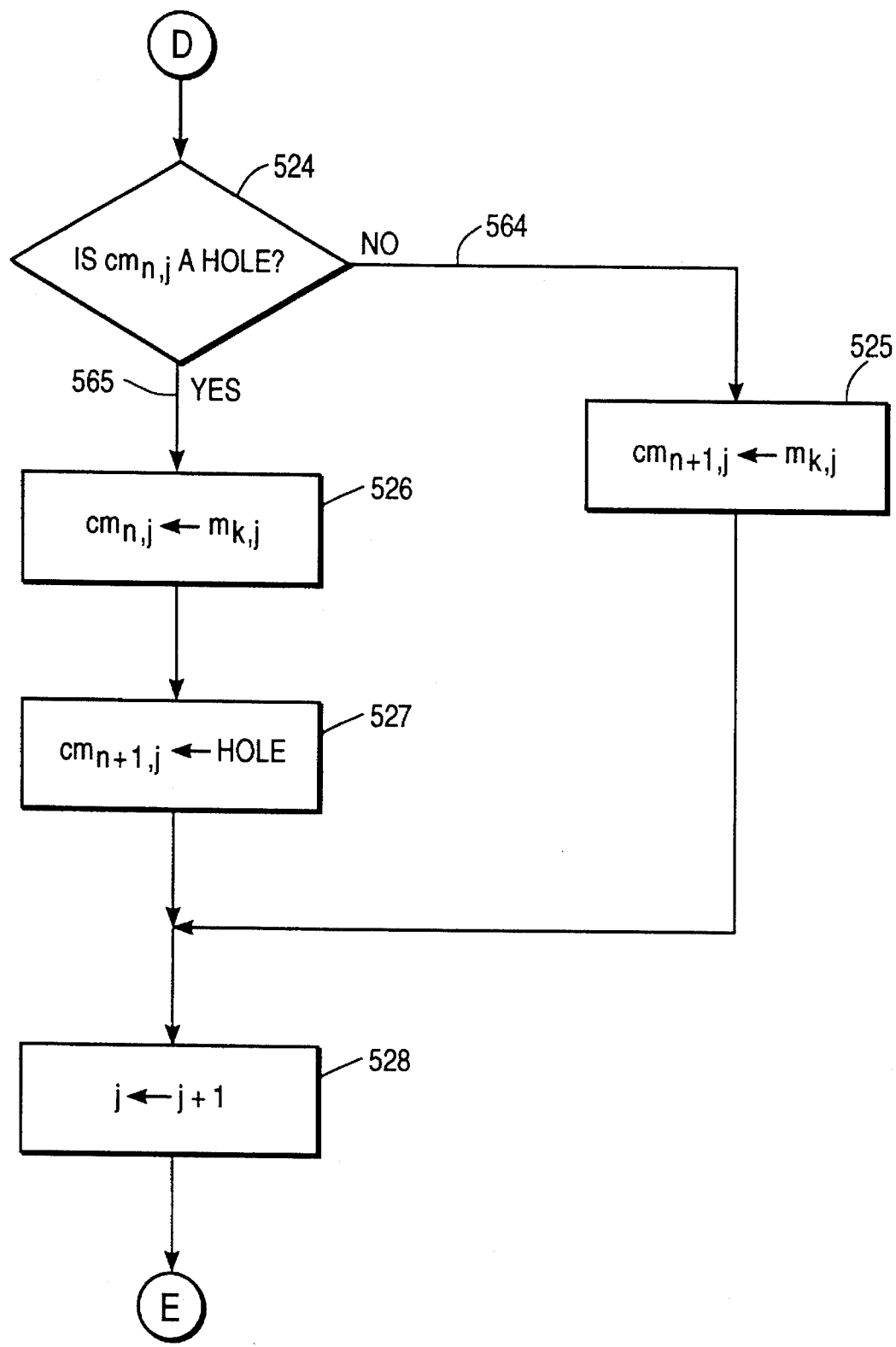
FIG_5D

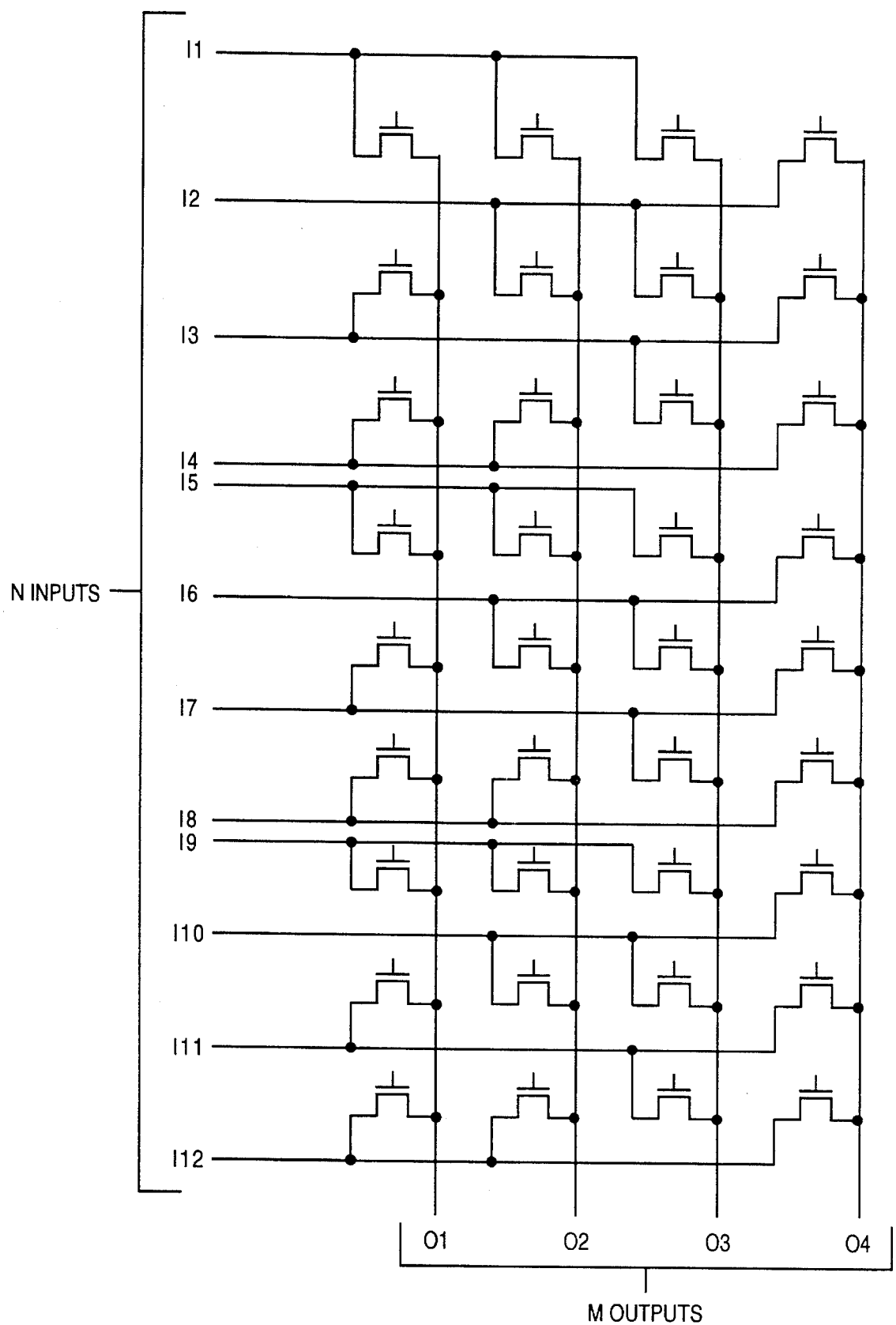
FIG_6

5,530,439

DETERMINISTIC METHOD AND AN APPARATUS FOR MINIMAL SWITCH CIRCUITS

This is a continuation of application Ser. No. 07/825,132, filed Jan. 24, 1992 now abandoned.

FIELD OF THE INVENTION

The present invention relates to field of switch circuit technology; in particular, the present invention relates to a deterministic method for generating and routing minimal switch circuits.

BACKGROUND OF THE INVENTION

Today, most electronic equipment contain and utilize switches. The ideal switch behaves like a mechanical switch. In the "on" state, a signal is passed through to a load without attenuation or non-linearity. In the "off" state, the switch acts as an open circuit. Electronic switches are usually comprised of transistor logic in order to take advantage of the quick rapid switching, typically within a quarter of a nanosecond. Field effect transistors (FETs) are normally employed in logic-switching applications. In practice, metal-oxide semiconductor FET (MOSFET) integrated circuits (rather than discrete transistors) are utilized in all digital logic and linear switch applications.

A specific application of switch technology is switch matrices, an example of which is shown in FIG. 1. Conceptually, a switch matrix 100 receives N inputs and produces M outputs. The function of switch matrix 100 is to allow M number of outputs to be selected from N number of inputs. Thus, various groupings of M number of outputs can be selected from the N inputs. Switch matrix 100 selects according to the control received as an input. When switch matrix 100 receives N input signals and produces M number of outputs, switch matrix 100 is referred to as an N×M matrix. The number of unique combinations of M outputs from switch matrix 100 for a given number of N inputs is given by the equation:

$$C = N! \div ((N-M)! \times M!)$$

An example of a prior art implementation of a switch matrix is shown in FIG. 2. Referring to FIG. 2, inputs I1–I12 are coupled to outputs O1–O4 using transistors. Inputs I1–I12 constitute rows in switch matrix 200. Outputs O1–O4 constitute the columns of switch matrix 200. Since switch matrix 200 receives 12 inputs and produces 4 outputs, switch matrix 200 is referred to as a 12×4 matrix. The transistors of switch matrix 200 couple each of the I1–I12 inputs to each of the column outputs O1–O4. The transistors of switch matrix 200 function as switches, such that the application of a control voltage on the gate of any one of the transistors allows the input to be coupled to the corresponding output. Thus, for a N×M switch matrix having twelve possible input connections taken as a grouping of four at any one time, the prior art switch matrix 200 would be a 12×4 matrix requiring forty-eight transistors (as shown).

The example of the switch matrix 200 in FIG. 2 is referred to as 100% connectable switch matrix. The concept of 100% connectable refers to a switch matrix wherein any possible M grouping of outputs can be taken without limitation. In this manner, all possible outputs can occur and are not restricted in any path by the inputs to the system. Thus, because any of the four outputs in switch matrix 200 can be taken for any of the twelve inputs, switch matrix 200 is 100% connectable.

As a switch matrix receives larger numbers of N inputs and larger numbers of M outputs, the switch matrix grows very large. A very large switch matrix typically can have hundreds of inputs and hundreds of outputs. Such a large switch matrix receiving many inputs and producing many outputs requires numerous transistors to switch the inputs to the proper output columns. Such a large switch matrix requires a large area to accommodate the number of transistors and is very costly in its implementation. Furthermore, the performance of such a matrix can be affected by the loading effect of the numerous transistors within the matrix. As more and more transistors are added, the capacitive load at any particular node in the switch becomes larger and larger and is driven by a fixed sized transistor. The size of the transistor can be increased, but then all the transistors must be increased and the load grows proportionally. This produces little gain, and, therefore, performance is very much a function of the number of devices in the switch matrix. Thus, the number of transistors corresponds to the area benefit and the performance benefit of the switch matrix. Hence, any reduction in the area or improvement in the performance can occur by reducing the number of switches (i.e., transistors) in the switch matrix.

Typically, in the prior art to reduce the number of switches (i.e., transistors) in the switch matrix, rows are eliminated. In this manner, the size of the switch matrix is reduced. By eliminating rows, inputs themselves are removed. Therefore, reducing the size by row reduction causes less than one hundred percent connectability and, thus, one hundred percent routability of inputs to outputs. Therefore, all possible outputs (i.e., M groupings) cannot be obtained. Less than one hundred percent connectability is permissible in some applications. However, in any less than one hundred percent connectability application, one must recheck the system to verify the proper outputs are obtained. Thus, an extra step is required to produce and generate the proper outputs from a set of inputs.

Another approach to eliminating and minimizing the size of a switch matrix is to intuitively remove transistors from the switch matrix. By performing this operation, the switch matrix can be reduced and still return the proper outputs (i.e., remain 100% connectable). However, performing such an operation on a system having large numbers of inputs and outputs is difficult because it is difficult to determine when the switch matrix is no longer capable of outputting one of its requisite outputs in response to one set of inputs. Thus, difficulty remains in using an intuitive approach when ascertaining whether one hundred percent connectability and routability (i.e., the routing of inputs to specific outputs) is still achieved.

As will be seen, the present invention provides a deterministic method to generate a minimal switch matrix. The matrix generated by the present invention is uniformally distributed with virtually no skew between inputs. Furthermore, the present invention generates a switch matrix of the minimum size required to result in one hundred percent routability and connectability. Also, the present invention provides the corresponding inter-connect layout for the circuit. Moreover, the present invention provides a method for routing the signals within the switch matrix in both a finite space and in a guaranteed time.

SUMMARY OF THE INVENTION

A deterministic method and apparatus for minimal switch circuits is described. The method and apparatus involves means for determining the minimum number of rows of switches for a switch matrix having N inputs taken M outputs at a time which are necessary to produce all of the possible combinations of the M outputs. In the currently preferred embodiment, the minimum number of rows is equal to ((N−M)+1). The apparatus and method also involves distributing the N inputs among each of the switches in the minimum number of rows, wherein each row has M number of switches, each coupled to a distinct one of the M outputs.

In one embodiment, the present invention includes an apparatus and method for redistributing subsequent cycles of N input switch assignments if the distribution of N inputs has not produced a switch matrix capable of outputting all possible combinations of M outputs. In the currently preferred embodiment, the redistribution is achieved by cycling each subsequent cycle of the N inputs. Moreover, the distribution of inputs throughout the switch matrix minimizes skew between the inputs.

The present invention also includes the method and apparatus for eliminating rows of the switch matrix, such that less than 100% connectability and routability is achieved, yet the highest percentage of routability and connectability is still attained for the resulting number of rows.

The present invention also includes a method and apparatus for implementing the minimal switch matrix including the ability to expand the minimal switch matrix to N×M rows having holes and the ability to compress the N×M matrix to eliminate the holes and produce a minimal switch matrix in which any input is no more than two adjacent rows apart.

BRIEF DESCRIPTION OF DRAWINGS

The present invention will be understood more fully from the detailed description given below and from the accompanying drawings of the preferred embodiments of the invention, which, however, should not be taken to limit the invention to this specific embodiment, but are for explanation and understanding only.

FIGS. 4A, 4B and 4C are flow charts illustrating minimal switch matrix generation by the processing logic of the present invention.

FIGS. 5A, 5B, 5C, and 5D are flow charts illustrating the currently preferred embodiment of matrix compression performed by the processing logic of the present invention.

FIG. 6 is an example of a circuit schematic representing a minimal switch circuit generated by the present invention.

DETAILED DESCRIPTION OF THE INVENTION

A deterministic method for minimal switch circuits is described. In the following description, numerous specific details are set forth, such as specific numbers of transistors, cycles, iterations, etc., in order to provide a thorough understanding of the preferred embodiment of the present invention. It will be understood to one skilled in the art that the present invention may be practiced without these specific details. Also, well-known circuits have been shown in block diagram form, rather than in detail, in order to avoid unnecessarily obscuring the present invention.

In addition, in describing the present invention, reference is made to signal names peculiar to the currently preferred embodiment. Reference to these specific signals names should not be construed as a limitation on the spirit or scope of the present invention. Moreover, the switch matrices depicted in the figures are n-channel metal-oxide semiconductor (NMOS) transistors. It will be understood to one skilled in the art that the present invention may be practiced with any type of switch or switching element.

Overview of the Computer System of the Present Invention

Figure 3:
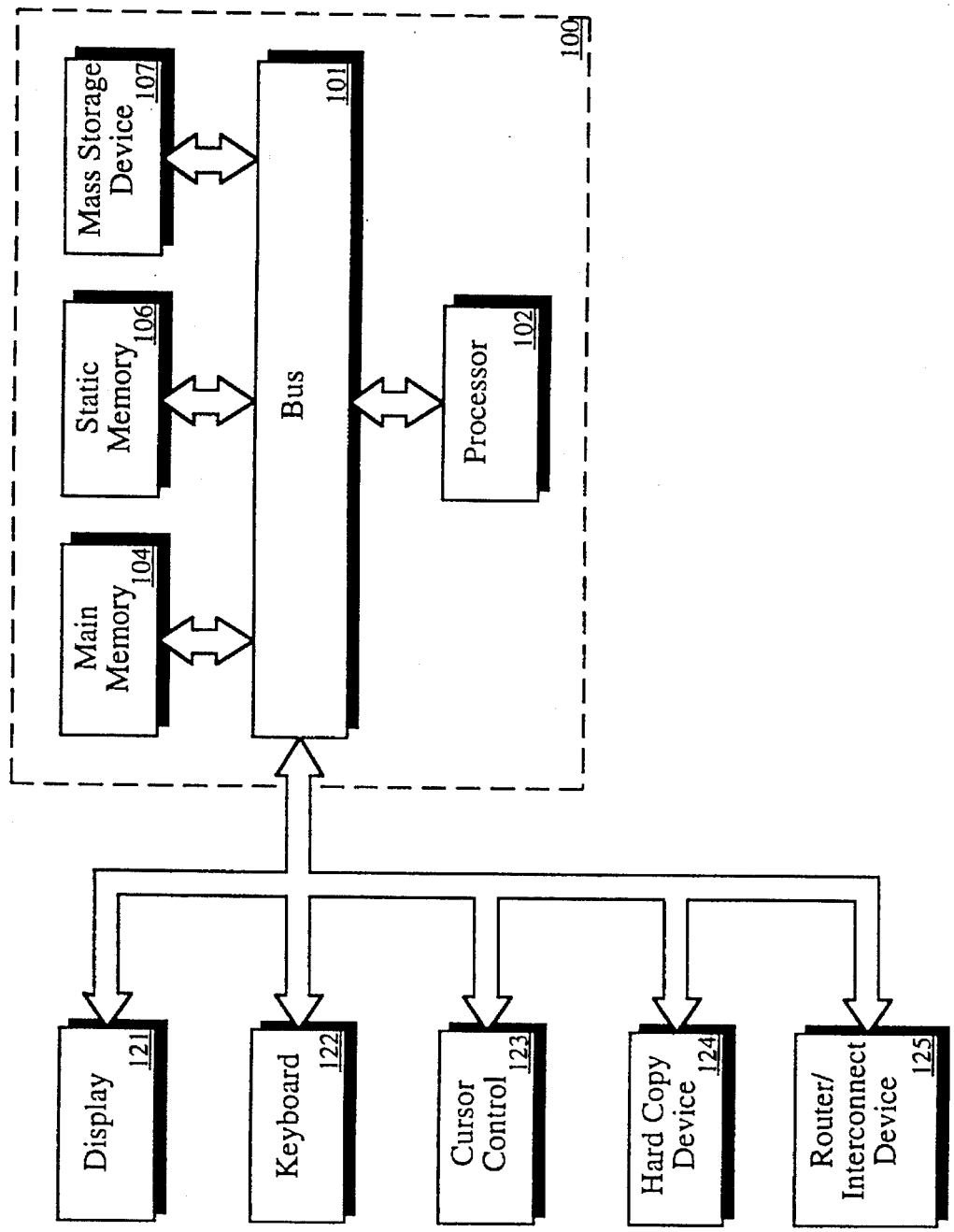
FIG. 3 is a block diagram of the computer system of the present invention.

Referring to FIG. 3, an overview of the computer system of the present invention is shown in block diagram form. It will be understood that while FIG. 3 is useful for providing an overall description of the computer system of the present invention, a number of details of the system are not shown. As necessary for disclosure of the present invention, further detail is set forth with reference to the other figures provided with this specification. Further, the present invention is described with reference to its preferred embodiment; alternative embodiments which may be conceived by one of ordinary skill in the art are considered within the scope of the claims set forth below.

As illustrated in FIG. 3, a computer system, as may be utilized by the preferred embodiment of the present invention, generally comprises a bus or other communication means 101 for communicating information, a processing means 102 coupled with bus 101 for processing information, a random access memory (RAM) or other dynamic storage device 104 (commonly referred to as a main memory) coupled with bus 101 for storing information and instructions for a processing means 102, a read-only memory (ROM) or other static storage device 106 coupled with bus 101 for storing static information and instructions for processing means 102, a data storage device 107, such as a magnetic tape and disk drive, coupled with bus 101 for storing information and instructions, a display device 121, such as a cathode ray tube, liquid crystal display, etc., coupled to bus 101 for displaying information to the computer user, and an alpha-numeric input device 122 including alpha-numeric and other keys, etc., coupled to bus 101 for communicating information and command selections to processor 102 and a cursor control 123 for control and cursor movement. The system also includes a hard copy device 124, such as a plotter or printer, for providing a visual representation of the computer images. Hard copy device 124 is coupled with processor 102, main memory 104, static memory 106 and mass storage device 107 through bus 101. Finally, the system includes a router/interconnect device 125 for providing the inter-connect circuit layout for a minimal switch circuit in response to a switch connection matrix on its inputs.

Of course, certain implementations and uses of the present invention may not require nor include all the above components. For example, in certain implementations a keyboard or cursor control device for inputting information to the system may not be required. In other implementations, it may not be required to provide a display device for displaying information.

Operation of the Present Invention

Deterministic Method for Minimal Switch Circuits

The present invention provides a deterministic method in which modeling, analysis, and implementation of a minimal switch matrix logic circuit is accomplished. Inputs into the processing logic of the present invention comprise the sample size and the grouping size. The sample size refers to the number of N inputs into the switch matrix. The grouping size refers to the number of M outputs from the switch matrix in response to the control signal. The number N is greater than the number M. The output produced by the processing logic of the present invention is a switch matrix implementation with the matrix in its minimal form, thus creating a smaller and faster circuit. Additionally, the number of rows in the switch matrix produced by the present invention is the minimum number needed such that all combinations (i.e., 100% connectability) of any connections (i.e., inputs) can be routed through the switch matrix (i.e., to produce outputs).

As disclosed previously, a sample size of N inputs (i.e., elements), taken M groups at a time, produces a number of unique combinations, C, given by the equation:

$$C = N! \div ((N-M)! \times M!)$$

The processing logic of the present invention is operably disposed within main memory 104 and, executed by processor 102 of the computer system described above. The processing logic of the present invention may equivalently be disposed in static memory 106 or other memory means (i.e., mass storage 107) accessible to processor 102 for execution. This processing logic can be a separately compiled or loaded entity or incorporated as a part of a larger operating system or application system. In either case, a means for activating the processing logic of the present invention may be performed using techniques well-known to those of ordinary skill in the art. Once activated, the processing logic of the present invention operates in a manner described below and illustrated in FIGS. 4 through 8.

Referring now to FIG. 4, the processing logic of the present invention is depicted. This logic is presented in the form of a procedure named Matrix Method for Minimalizing Switch Circuits which is conveniently called by other applications or system software to generate a switch matrix implementation in minimal form. It will be apparent to those skilled in the art that the processing logic of the present invention could equivalently be implemented as in-line or non-procedural logic.

When the processing logic of the present invention is initially activated using techniques well-known in the art, processing begins at the processing box 400 as shown in FIG. 4A. After initializing several variables used in the process, the matrix method 400 initially determines the number of rows for a given sample size of N elements, taken M groups at a time. Initially, as depicted in processing block 401, the minimum number of rows, R, to implement a matrix of M columns with all combinations (i.e., 100% connectability and routability), C, of N by M is given by the equation:

$$R = ((N-M)+1)$$

Next, a two-loop index variables j and i are initialized to the value zero (processing block 402). A loop is then started at decision block 403 where a loop condition is tested. If the loop index variable j becomes equal to the minimum number of rows R, the loop termination condition is satisfied (processing path 451) and the processing drops to processing block 409. If the loop termination condition is not satisfied (processing path 450), the processing drops to processing block 404. Decision block 403 determines when the minimal switch matrix distribution is completed.

Processing block 404 begins the distribution of the various sample N elements to switch matrix locations. At processing block 404, a loop index variable k is initialized to the value zero. A loop is then started at decision block 405 where a loop termination condition is tested. If the loop index variable k becomes equal to the number of columns M (i.e., the number of outputs), the loop termination condition is satisfied (processing path 452) and processing drops to processing block 408. If the loop termination condition is not satisfied (processing path 453), matrix procedure 400 assigns the matrix location of j, k to the value given (processing block 407) determined by:

$$(i \bmod N) + 1$$

In this manner, each switch location in a minimal switch matrix having the minimum number of rows R coupled to M number of output columns is assigned one of the N inputs. Next, the loop index variable i and index variable k are incremented by one (processing block 406), execution control loops back to decision block 405, and the loop processing continues until the loop termination condition is satisfied.

Once the loop termination condition is satisfied (processing path 452), the loop index variable j is incremented by one (processing block 408). The execution control then loops back to decision block 403, and the loop processing continues until the loop termination condition of the loop index variable j is equal to the minimum number of rows R, which occurs when all of the locations in the minimal switch matrix have been assigned one of the N inputs.

When the loop index variable j equals the minimum number of rows R (processing path 451), the processing logic has completed its distribution of the inputs into the minimal switch matrix, and the processing drops to decision block 409. Decision block 409 tests a loop termination condition. Processing block 409 tests whether the number of N inputs is evenly divisible by the number of outputs M. If the condition of decision block 409 is not satisfied (processing path 454), the processing terminates with the execution of a return statement (processing block 410). The non-satisfaction of the condition at decision block 409 indicates that all of the switch locations in the minimal switch matrix having R rows of switches and M output columns have been assigned, such that a minimal switch matrix having the minimum number of rows of switches and being 100 percent connectable.

If the condition of decision block 409 is satisfied (processing path 455), the processing continues at the bubble labeled A as depicted in FIG. 4B. The satisfaction of the condition indicates that the input allocations to the switches in the R×M matrix are identical for each cycle of input allocations. A cycle of inputs refers to the group of allocations of inputs 1 through N throughout the matrix. All of the N inputs are allocated to the switch locations starting at the first of R rows and going left to right until all the locations in all of the rows have been assigned one of the N inputs.

When the number of N inputs is evenly divisible by the number of outputs, each allocation of inputs 1 to N is in the same column position (i.e., each input is distributed to the same column output). Under this type of allocation, the switch matrix is not 100 percent connectable and does not have 100 percent routability. Therefore, the following portion of processing changes the input allocations to insure that the generated switch matrix is 100 percent connectability and routability.

Referring to FIG. 4B at the bubble labeled A, the processing continues by determining the number of cycles, S, of the sample set N, ($N_0$, $N_1$, $N_2$ . . . $N_{n-1}$), required to distribute within a matrix of R rows by M columns. Given a sample size of N elements, taken M groups at a times, the number of cycles is given by the equation (processing block 411):

$$S = R \div (N \div M)$$

Next, a loop index variable i is initialized to the value one (processing block 412). A loop is then started at the decision block 413 where a loop termination condition is tested. If the loop index variable i becomes equal to one greater than the number of cycles S, the loop termination condition is satisfied (processing path 456) and processing terminates with the execution of a return statement (processing block 430). The satisfaction of the condition indicates that the N cycles of inputs have been reallocated to produce a minimal switch matrix having 100 percent connectability and routability.

If the loop termination condition is not satisfied (processing path 457), the processing drops to processing block 414 where the value of the variable k is set to the value determined according to the equation given by k= ((N÷M)×i). Next, a loop is started at decision block 415 where a loop termination condition is tested. If the value of the minimum number of rows R minus the value of variable k (as determined in processing block 414) is less than the quotient of N divided by M, the loop termination condition is satisfied (processing path 459) and processing drops to processing block 417, where a variable h is set to the result of subtracting the value of variable k from the minimum number of rows R. If the loop termination condition is not satisfied (processing path 458), the processing drops to processing block 416 where the variable h is set to the result of dividing the number of inputs N by the number of outputs M.

Once processing from processing blocks 416 or 417 has completed, processing drops to processing block 418 where the variable j is initialized to the value of the k variable. A loop is then started at decision block 419 where a loop termination condition is tested. If the indexed variable j is equal to the value of the addition of the values of variables k and h, the loop termination condition is satisfied (processing path 460) and processing continues at processing block 421. The satisfaction of this loop termination condition indicates that the current cycle of N inputs has been reassigned to switch locations in the R×M switch matrix. As will be shown below, the reassignment of the cycle of N inputs is done by shifting the input allocations for each switch in the row to the right with the switch allocation at the end of the row being "barrel" shifted to the beginning of the same row. At processing block 421, the index variable i is incremented by one, execution control loops back to decision block 413, and the loop processing continues until the loop termination condition is satisfied. If the loop termination condition at decision block 419 is not satisfied, the processing continues at bubble labeled B (processing path 461). Referring to FIG. 4C at bubble labeled B, the processing continues. The processing continues by first initializing a loop index variable g to the value zero (processing block 420).

A loop is then started at decision block 422 where a loop termination condition is tested. If the value of variable g is equal to the number of outputs M, the loop termination condition is satisfied (processing path 463) and processing drops to processing block 425. If the loop termination condition is not satisfied (processing path 462), the processing drops to processing block 423. In processing block 423, a temporary matrix location defined by row j and column ((g+ i) mod M) is assigned to the value of the matrix at row j, column g. Then the loop index variable g is incremented (processing block 429), execution control loops back to decision block 422, and the loop processing continues until the loop termination condition is satisfied. The satisfaction of the condition indicates that each of the switch assignments of the inputs in the current row has been placed into a temporary matrix in a location which is shifted one switch position to the right of its location in the switch matrix. The last switch position in the row is shifted around to the first position in the row.

Once the loop termination condition is satisfied (processing path 463), another loop index variable g is initialized to zero (processing block 425). A loop is then started at decision block 426 where a loop termination condition is tested. If the loop index variable g is equal to the number of outputs M (i.e., output columns M), the loop termination condition is satisfied (processing path 464) and the index variable j is incremented (processing block followed by the execution looping back to decision block 419. The satisfaction of the condition indicates the completion of the reassignment for that particular cycle of N inputs assignments. However, if the loop condition of processing block 426 is not satisfied (processing path 465), processing drops to processing block 427. At processing block 427, the matrix location defined at row j and column g in the R rows×M output columns matrix is assigned the value at the temporary matrix location at row j and column g. Next, the index variable g is incremented by one, execution control loops back to decision block 426, and a loop processing continues until the loop termination condition of decision block 426 is satisfied. The satisfaction of the condition indicates that the values stored in the temporary matrix have been copied into the minimal switch matrix. Included in Appendix A herein is the pseudocode for the previously described embodiment.

Figure 1:
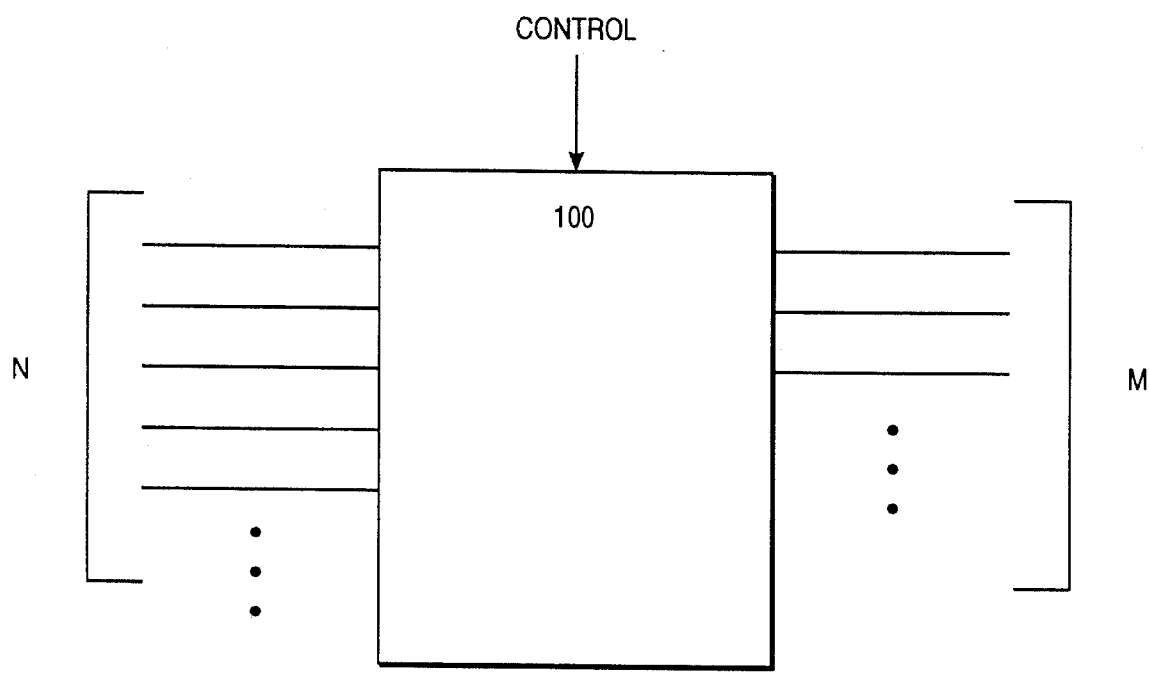
FIG. 1 is a block diagram of a switch matrix.
Figure 2:
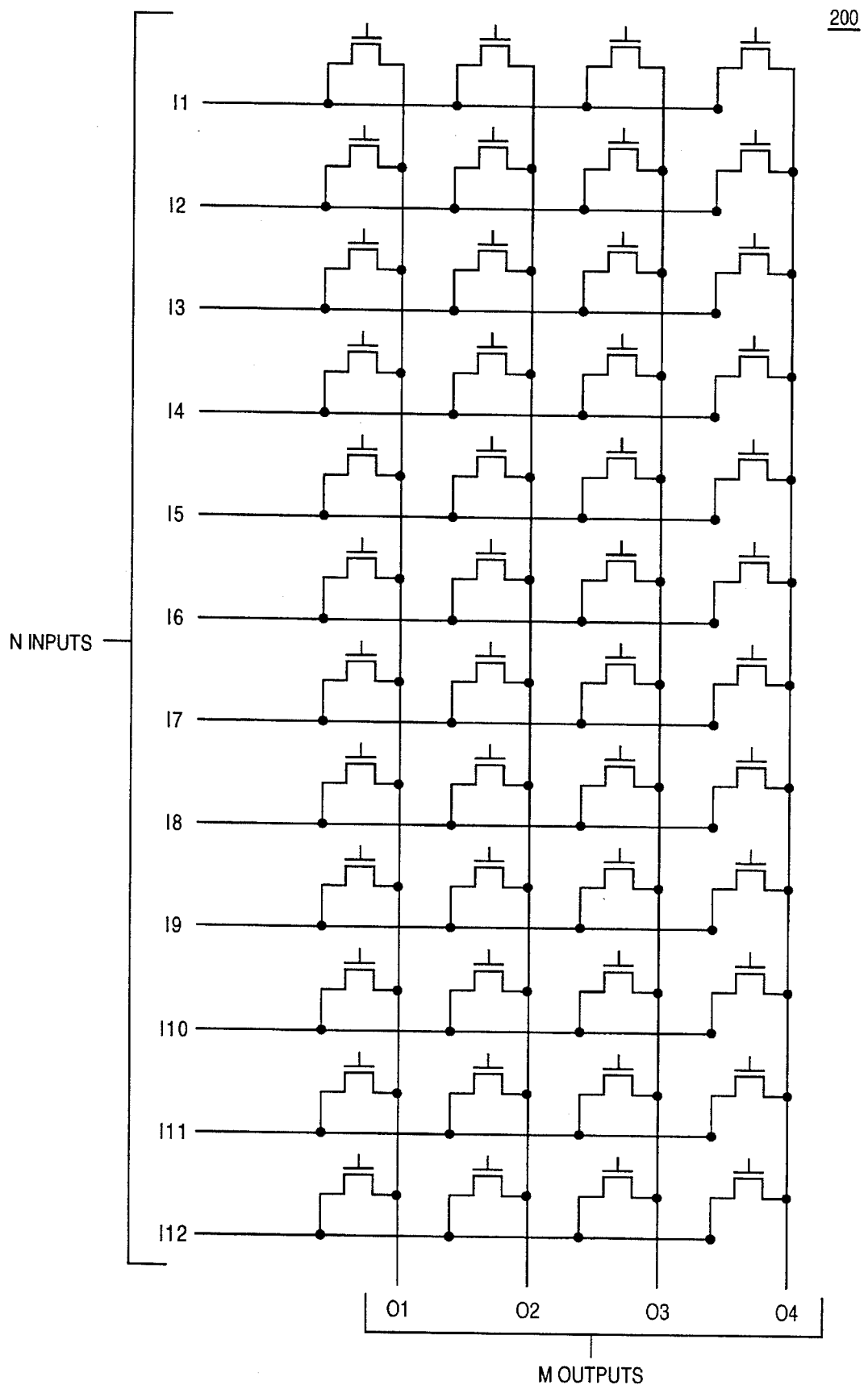
FIG. 2 is a circuit schematic of a prior art implementation of a 12×4 switch matrix.

An example of the operation of the method can be seen by utilizing the prior art shown in FIG. 2. To reiterate, given a set of twelve available input signals, where 100% routability and connectability to a given circuit is desired, the prior art generates a switch matrix which allows four of the signals to be chosen. Thus, a twelve choose four condition exists. The switch matrix generated by the prior art is shown as Table 1:

TABLE 1

| | | | |
|---|---|---|---|
| 01 | 01 | 01 | 01 |
| 02 | 02 | 02 | 02 |
| 03 | 03 | 03 | 03 |
| 04 | 04 | 04 | 04 |
| 05 | 05 | 05 | 05 |
| 06 | 06 | 06 | 06 |
| 07 | 07 | 07 | 07 |
| 08 | 08 | 08 | 08 |
| 09 | 09 | 09 | 09 |
| 10 | 10 | 10 | 10 |

TABLE 1-continued

| | | | |
|---|---|---|---|
| 11 | 11 | 11 | 11 |
| 12 | 12 | 12 | 12 |

Each location in the above switch matrix corresponds to a switch coupling an input signal to one of the output columns M. Thus, row 1 is viewed as having an input signal 01 coupled to each of the columns 1–4. The same goes for inputs 02–12, in that they are coupled to each of the four output columns with a transistor. Thus, as shown above, the switch matrix of the prior art requires 48 switches (12 inputs×4 output columns=48 switches).

Using the above minimal matrix procedure of the present invention described above, initially the minimum number of rows R is determined according to the equation $((N-M)+1)$. Therefore, the minimum number of rows in a switch matrix having 12 inputs and generating (or grouping) 4 outputs at a time is equal to nine (i.e., 12−4+1=9). Thus, the 12×4 matrix is reduced to a matrix having nine rows of switches.

After the minimum number of rows has been determined, the procedure of the present invention assigns inputs to switch locations in the nine rows of switches in the minimal matrix sequentially through the rows. Thus, each switch location across each of the nine rows is assigned an input value. The result of this operation is shown in Table 2:

TABLE 2

| | | | |
|---|---|---|---|
| 01 | 02 | 03 | 04 |
| 05 | 06 | 07 | 08 |
| 09 | 10 | 11 | 12 |
| 01 | 02 | 03 | 04 |
| 05 | 06 | 07 | 08 |
| 09 | 10 | 11 | 12 |
| 01 | 02 | 03 | 04 |
| 05 | 06 | 07 | 08 |
| 09 | 10 | 11 | 12 |

It should be noted that any assignment scheme is possible which allows each input to be loaded equally (i.e., assigned) or within one of any other input in the matrix. Thus, as shown above the inputs are assigned repeatedly 1–12 to matrix locations. Each assignment of inputs 1–12 is one cycle. Thus, in the above 9 row minimal matrix, there are three cycles of the inputs 1–12 assigned to matrix locations: rows 1–3, rows 4–6 and rows 7–9.

Next, because the number of inputs is evenly divisible by the number of outputs, a cycle shift must be performed to the second and third cycles of the above matrix in order to distribute the inputs 1–12 throughout the matrix to ensure 100% connectability and routability. Initially, to perform the requisite cycle shifts, the number of cycles S is determined according to the equation $R \div (N \div M)$, where R is the minimum number of rows. Thus, the number of cycles is 3 (i.e., $9 \div (12 \div 4)=3$). Next, each successive cycle in the matrix is shifted one column to the right, such that each row assignment for the shifting cycle moves to the right one position with the row assignments shifting to the beginning of the row. For example, row 4 goes from assignments of 01, 02, 03, 04 to 04, 01, 02, 03. Each subsequent cycle in the matrix is shifted another column to the right. Therefore, in the 9 row minimal switch matrix with the assigned input values, the first cycle is not shifted and remains the same. The second cycle is shifted one column, such that the inputs are moved to the right one column, and the last cycle is shifted a total of two columns both moving to the right. After the cycle shifting has been completed the switch matrix assignments appear in Table 3 below:

TABLE 3

| | | | |
|---|---|---|---|
| 01 | 02 | 03 | 04 |
| 05 | 06 | 07 | 08 |
| 09 | 10 | 11 | 12 |
| 04 | 01 | 02 | 03 |
| 08 | 05 | 06 | 07 |
| 12 | 09 | 10 | 11 |
| 03 | 04 | 01 | 02 |
| 07 | 08 | 05 | 06 |
| 11 | 12 | 09 | 10 |

It should be noted that in performing the cycle shifting, the direction of the shift could be to the left as well. Once the cycle shifting has been completed the switch matrix is in a form which can be laid out and routed for performance and cost considerations. Hence, a nine row by four columns switch matrix is generated capable of accommodating 12 inputs taken 4 at a time with 100% connectability and routability.

Also of note is the fact that another method of distribution of the N inputs to matrix switch locations is possible. Once the number of rows of switches has been determined for the switch matrix, the N inputs can be distributed in order across the rows of switches, such that each subsequent row starts with the input subsequent by one in the order of the inputs to the input which began the previous row. Therefore, a portion of successive rows in the switch matrix for a set of inputs $\{n, n+1, n+2, \ldots\}$ appears as:

| | | | |
|---|---|---|---|
| $n$ | $n+1$ | $n+2$ | . . . |
| $n+1$ | $n+2$ | . . | . . . |
| $n+2$ | . | . . | . . . |

Apply the distribution method to the example as shown above if a switch matrix having 12 inputs, 4 outputs and 9 rows of switches (i.e. 12−4+1= 9) produces a distribution as shown in Table 4.

TABLE 4

| | | | |
|---|---|---|---|
| 1 | 2 | 3 | 4 |
| 2 | 3 | 4 | 5 |
| 3 | 4 | 5 | 6 |
| 4 | 5 | 6 | 7 |
| 5 | 6 | 7 | 8 |
| 6 | 7 | 8 | 9 |
| 7 | 8 | 9 | 10 |
| 8 | 9 | 10 | 11 |
| 9 | 10 | 11 | 12 |

The switch matrix generated by this distribution method is 100% connectability and routability. However, some of the inputs appear less often than others. For instance, inputs 01 and 12 only appear once, while inputs 04–09 appear four times. Since inputs 01 and 12 only appear once in the matrix, only one connection (e.g., transistor is required), as opposed to the inputs 04–09 having four connections. Since some of the inputs have less connections (i.e., switches) their individual drivers, which produce the outputs from the inputs, drive less numbers of switches (e.g., transistors). Since there are less transistors to drive, there is less capacitive load. Moreover, the inputs having multiple connections are spread apart. Thus, in implementing such a matrix, the input lines to the multiple connections are longer than those of the lesser loaded inputs. The variations in capacitive load and variations in the distances of input lines produces skew between inputs. Hence, although a switch matrix having 100% connectability and routability is generated by distributing the N inputs by starting input assignments in successive rows with the input successive in order to the one which started the previous row, the resulting matrix does have skew problems. Therefore, the matrix generated by the latter distribution method has skew between the inputs.

Thus, the minimal matrix procedure of the present invention generates the minimal size of a switch matrix needed to result in 100% routability and connectability. The procedure as shown above provides the corresponding inter-connect layout for the circuit in that each of the assigned inputs in the final generated switch matrix corresponds to a switch connecting one of the inputs to one of the output columns. In this example, since the number of rows were reduced from twelve to nine, a 25% reduction in size occurred. Thus, there is a savings in size and cost, and there is a performance benefit due to the reduced matrix size, fewer numbers of switches, smaller columns and reduced loads. Furthermore, because the number of inputs is evenly distributed throughout the switches in the matrix, skew problems do not occur.

Inter-connect Layout Procedure of the Present Invention

Once a minimal switch matrix has been generated using the minimal matrix procedure of the present invention, a second matrix procedure, entitled Matrix Compression, is utilized to benefit implementation and further increase performance. The focus of the Matrix Compression procedure is to localize the same inputs to each other in the matrix. The Matrix Compression procedure sorts the switch matrix generated from the first procedure described above and arranges the matrix, such that a given input is never more than two adjacent row lines apart.

The present invention provides a deterministic method for generating an interconnect layout scheme for a switch matrix having a R number of rows of switches which is less than the number of inputs N, wherein the outputs are taken M groupings at a time. The layout scheme of the present invention comprises two steps. The first step involves sorting the R rows for each input to determine their corresponding switch locations. The second step involves compressing the results of the first step into a switch matrix, such that any given input is no more than two adjacent lines apart.

The first step of the layout scheme of the present invention is the sorting of the matrix. The processing logic initially receives the R×M matrix generated by the minimal matrix procedure described above, or any matrix in which the number of rows of switches is less than the number of rows of inputs. Because any individual switch within the matrix is only limited to the input and the output column it couples, a switch can appear in any row within the matrix. The switch matrix is scanned and the rows of the switch matrix are sorted in order to group the rows having the same inputs. Next, separate rows for each of the inputs are generated. This effectively expands the R×M matrix to an N×M matrix of separate rows, each row having switch assignments for a particular input.

The result of the compression is a matrix in which each of the N inputs are within two consecutive rows in the matrix. Each column designation within each row is also marked where a switch exists or where no value or assignment exists (i.e., a hole).

An example of the result of the compression of the generated rows into a compressed N×M matrix can be seen by revisiting the example of the 9 row and 4 column minimal switch matrix generated by the minimal matrix procedure above. The result of the compression is a 12×4 matrix below in Table 5:

TABLE 5

| 1  | 1  | 1  | —  |
|----|----|----|----|
| —  | 2  | 2  | 2  |
| 3  | —  | 3  | 3  |
| 4  | 4  | —  | 4  |
| 5  | 5  | 5  | —  |
| —  | 6  | 6  | 6  |
| 7  | —  | 7  | 7  |
| 8  | 8  | —  | 8  |
| 9  | 9  | 9  | —  |
| —  | 10 | 10 | 10 |
| 11 | —  | 11 | 11 |
| 12 | 12 | —  | 12 |

Once again, the underlined column assignments represent the part of the rows having no values (i.e., holes), and the numbers designate switch locations coupling each input to an output column.

Thus, the result of the first step in the inter-connect layout procedure of the present invention is to expand an R×M matrix having a distribution of input assignments to output columns into an expanded N×M matrix wherein each row in the matrix corresponds to a particular input with its respective column assignments (and hole designations).

The second step in the inter-connect layout procedure compresses the expanded N×M matrix into an $(((N-M)+1))\times M$ matrix, or in other words, an R×M matrix. The procedure employed by the processing logic to compress the N×M matrix can be used to compress any switch matrix having holes into a matrix without holes.

Referring to FIG. 5, the processing logic of the present invention is depicted. This logic is presented in the form of a procedure named Matrix Compression which is conveniently called by other applications or system software to compress an N×M matrix into an $(((N-M)+1))\times M$ matrix. Thus, the input into the procedure is a N×M matrix with holes, and the output is a compressed R×M matrix with no holes. It will be apparent to the skilled in the art that the processing logic of the present invention could equivalently be implemented as in-line or non-procedural logic.

When the processing logic of the present invention is initially activated using techniques well-known in the art, processing begins at processing box 500 as shown in FIG. 5. After initializing several variables used in the process, the Matrix Compression procedure initially uses a procedure to mark all of the rows in the original N×M matrix that have not already been used (processing block 501). Then the processing logic sets the first row in the compressed matrix to all holes (processing block 502).

Next, the processing logic initializes group index variable n and loop index variable i to zero (processing block 503). A loop is then started at decision block 504 where a loop termination condition is tested. If the loop index variable i is equal to the number of inputs N, the loop termination condition is satisfied (processing path 550) and processing terminates with the execution of a return statement (processing block 529). The satisfaction of this condition indicates that all of the rows in the N×M matrix have been compressed into the R×M compressed matrix. If the loop termination condition is not satisfied (processing path 551), processing drops to processing block 505 where a loop index variable j is initialized to the value zero.

A loop is then started at decision block 506 where a loop termination condition is tested. If the loop index variable j is not equal to the number of outputs M, the loop termination condition is not satisfied (processing path 553) and processing drops to processing block 507 where a procedure marks the columns in the compressed R×M matrix that have no value (holes). Next, the loop in the next variable j is incremented by one (processing block 507), execution control loops back to decision block 505, the loop processing continues until the loop termination condition is satisfied. The satisfaction of the condition indicates that all of the column positions for a particular row in the compressed matrix have been marked.

Once the loop termination condition is satisfied (processing path 552), processing drops to decision block 509. At decision block 509, a condition is tested. If all of the columns in the compressed matrix are holes, the condition is satisfied (processing path 556) and processing continues at the bubble labeled A in FIG. 5B. If the condition is not satisfied (processing path 555), processing continues at the bubble labeled B in FIG. 5C.

Referring to FIG. 5B, if all of the locations in the current row compressed matrix are holes, a procedure finds the next unused row in the original N×M matrix (processing block 510) and marks that row as used (processing block 511). A loop index variable j is then set to the value of zero (processing block 512). A loop is then started at decision block 513 where a loop termination condition is tested. If the loop index variable j is not equal to the number of outputs M, then the loop termination condition is not satisfied (processing path 559) and processing drops to processing block 514, where the location in the compressed matrix at the row n and column j is assigned the input value from the original N×M matrix located at row k and column j. Next, the loop index variable j is incremented by one (processing block 515), execution control loops back to decision block 513, and the loop processing continues until the loop termination condition is satisfied. The satisfaction of the condition indicates that the switch locations in a row of the compressed matrix have been assigned the inputs of the switch locations in a particular row in the original N×M matrix. When the loop termination condition of decision block 513 is satisfied, the loop index variable i is incremented (processing block 570), and the processing continues at the bubble labeled C in FIG. 5A.

Referring back to FIG. 5A, if the loop termination condition of decision block 509 is not satisfied, processing continues at the bubble labeled B in FIG. 5C. Referring to FIG. 5C, a loop index variable k is initialized to the value of zero (processing block 516). A loop is then started at decision block 517 where a loop termination condition is tested. If the loop index variable k is equal to the number of inputs N, the loop termination condition is satisfied (processing path 560), the loop index variable n and index variable i are incremented by one (processing block 518), execution control continues at the bubble labeled C in FIG. 5A, and the loop processing continues into the loop termination condition of decision block 504 is satisfied. The satisfaction of the condition indicates that the holes in the current row have been filled using a row from the original matrix, such that the holes in the current row of the compressed matrix have been assigned the input designations found in the corresponding locations in the row of the original matrix.

If the loop termination condition is not satisfied (processing path 561), where the loop index variable k does not equal the number of inputs N, processing drops to decision block 519. In this case, the processing logic searches for a row in the original matrix that has switch designations that fill all of the holes in the current row of the compressed matrix. At decision block 519, a loop termination condition is tested. If the row in the original N×M matrix (designated by the number stored in the k variable) does not fill all the holes in the current row or of the compressed matrix and row k has not already been used, then the loop termination condition is not satisfied (processing path 567), loop index variable k is incremented by 1 (processing block 523), execution control loops back to decision block 517, and the loop processing block continues until the loop termination condition is satisfied. If row k does fill all the holes in row n, the loop termination condition is satisfied (processing path 566) and processing drops to processing block 520 where row k in the original matrix is marked as used (processing block 520) and another loop index variable j is initialized to a value of zero. Next, a loop is then started at decision block 522 where a loop termination condition is tested. If the loop index variable j is equal to the number of outputs M, the loop termination condition is satisfied (processing path 562) and processing loops back, drops to decision block 519 and continues processing. The satisfaction of the loop termination condition of decision block 522 indicates that the row and column locations of row in the original N×M matrix that fills all of the holes in the current row in the compressed matrix have been assigned to the holes in the current row of the compressed matrix. Moreover, it also indicates that the switch assignments of the row and column locations of the row in the original matrix that are not used to fill holes are assigned to the same respective locations in the following row of the compressed matrix. If the loop termination condition is not satisfied (processing path 563), the procedure continues at the bubble labeled D on FIG. 5D.

Referring to FIG. 5D, processing continues at decision block 524 where a condition is tested. If the current matrix location at row n, column j in the compressed matrix is not a hole, the condition is not satisfied (processing path 564) and processing drops to processing block 525. At processing block 525, the matrix location at row n, column j is assigned the matrix value at row n+1, column j in the original N×M matrix. After completion of the assignment, processing drops to processing block 528. If the location of the compressed matrix at row n, column j is a hole, the condition is satisfied (processing path 561), and processing drops to processing block 526. At processing block 526, the compressed matrix location at row n, column j is assigned the value of original N×M matrix at row k, column j. Then, the matrix location at row n+1, column j in the compressed matrix becomes a hole (processing block 527) and processing drops to processing block 528.

After the processing logic has dropped to processing block 528, the loop index variable j is incremented by one. Next, processing continues at bubble labeled E in FIG. 5C. Included in Appendix A is the pseudocode of the currently preferred embodiment of the compression method of the present invention.

An example of the operation of the Matrix Compression method can be seen by examining the previous example of 12×4 matrix created as a result of the first step of the inter-connect layout procedure. To reiterate, the matrix resulting from the application of the first step of the interconnect layout procedure is shown in Table 6:

TABLE 6

| 1 | 1 | 1 | — |
|---|---|---|---|
| — | 2 | 2 | 2 |
| 3 | — | 3 | 3 |
| 4 | 4 | — | 4 |
| 5 | 5 | 5 | — |
| — | 6 | 6 | 6 |
| 7 | — | 7 | 7 |
| 8 | 8 | — | 8 |

TABLE 6-continued

| 9  | 9  | 9  | —  |
|----|----|----|----|
| —  | 10 | 10 | 10 |
| 11 | —  | 11 | 11 |
| 12 | 12 | —  | 12 |

This 12×4 matrix is the original matrix operated on by the Matrix Compression procedure. Initially the processing logic marks all of the rows in the original 12×4 matrix as not used. Then, the processing logic sets the first row in the compressed matrix, such that every location in the rows does not have an input assigned to it. Thus, the first row in the compressed matrix is set to all holes. Next, the processing logic marks all of the locations having holes in the first row. Since no input assignments have been made to the compressed matrix, all the locations in the first row of the compressed matrix are holes.

Once the holes in the first row of the compressed matrix have been identified, the processing logic determines if all of the columns are holes. Since the locations in the compressed matrix have not been assigned values, all of the columns are holes. In response to this determination, the processing logic takes the first unused row in the original 12×4 matrix (i.e., the first row), marks it as used and fills the first row of the compressed matrix with the assignments (and holes) from the first unused row of the original 12×4 matrix. The result of the operation places the following input switch assignments in the first row of the compressed matrix:

| 01 | 01 | 01 | — |
|----|----|----|---|

Once the first row has been assigned values, the processing logic marks the holes in the compressed matrix, determining that not all of the columns in the first row have holes and searches the original matrix for a row which could fill the holes in the first row. In this case, the second row of the original matrix would fill the hole in the first row of the compressed matrix. Next, the processing logic would mark the second row in the original 12×4 matrix as used and then fills the fourth column position in the first row of the compressed matrix (i.e., where the hole exists) with the value assigned to the corresponding position in the second row of the original matrix. The next row in the compressed matrix is then set to the remaining values of the corresponding assignments of the second row. The result of the operation is:

| 01 | 01 | 01 | 02 |
|----|----|----|----|
| —  | 02 | 02 | —  |

The processing logic continues filling the holes in the compressed matrix with unused rows in the original 12×4 matrix. Once the compressed matrix fills all of the holes in a row which results in the row from the original matrix being only holes, the processing logic copies the next unused row of the original matrix into the compressed matrix. For instance, after the holes in the third row of the compressed matrix have been filled, the first four rows of the compressed matrix appears as:

| 01 | 01 | 01 | 02 |
|----|----|----|----|
| 03 | 02 | 02 | 03 |
| 04 | 04 | 03 | 04 |

In this situation, the fifth row of the original matrix is copied into the fourth row of the compressed matrix and then any hole in it are filled with any unused row in the original 12×4 matrix that fills all of its holes. Repeating the process for each row in the compressed matrix results in a (((N−M)+1))×M matrix as shown in Table 7:

TABLE 7

| 01 | 01 | 01 | 02 |
|----|----|----|----|
| 03 | 02 | 02 | 03 |
| 04 | 04 | 03 | 04 |
| 05 | 05 | 05 | 06 |
| 07 | 06 | 06 | 07 |
| 08 | 08 | 07 | 08 |
| 09 | 09 | 09 | 10 |
| 11 | 10 | 10 | 11 |
| 12 | 12 | 11 | 12 |

Thus, the 12×4 matrix with holes is reduced to a matrix having only 9 rows of switches. An implementation of the above compressed switch matrix is shown in FIG. 6, wherein each input is coupled to its assigned output column using a transistor in the same manner as the inputs in FIG. 2 coupled the inputs to the proper outputs.

It should be noted that in this case that although each subsequent row in the original matrix is compressed into the compressed matrix, the Matrix Compression method of the present invention is not limited to compressing rows according to the order of the inputs. Any row which fills all of the holes in the current row of the compressed matrix can be used. Furthermore, the Matrix Compression algorithm is not limited for use with minimal switch matrices generated by the minimal switch matrix algorithm. Thus, any matrix having holes can be compressed to some extent using the matrix compression method of the present invention.

Hence, the inter-connect layout procedure of the present invention produces a layout for a minimal switch matrix or any switch with holes which is less heavily loaded by having the same inputs localized to one another. Furthermore, each input is never more than two adjacent rows apart.

Deterministic Method for Routing Signals within a Switch Matrix

The present invention also provides a deterministic method of routing signals within a minimal switch matrix logic circuit. The matrix routing method of the present invention operates on the switch matrices of all sizes and is guaranteed to complete the routing of signals within the matrix in a finite time period. Although in the prior art, such as depicted in FIG. 2, the order of signals, in an N×M matrix is not important. In an (N−M)+1 matrix (i.e., R×M matrix), however, certain sequences of input signals cannot be directly routed. The matrix routing method of the present invention determines the proper routing of input signals within a fixed space and within a minimal amount of time.

There are two inputs into the matrix routing method. The first is a switch matrix, such as one generated by the minimal matrix method or compression method of the present invention. Other evenly distributed matrices or those having inputs distributed within one of any other input can also be utilized by the present invention. Secondly, a set of signals to route through the matrix is required. The output produced by the matrix routing method is a listing of the routing connections to enable the requisite outputs be produced for a particular set of inputs. These routing connections can be utilized by the control signals of the switch matrix to switch the proper input to the proper output. For instance, the routing connections can be utilized to turn on a switch transistor in a switch matrix by the application of a voltage on its gate. Thus, for a given switch matrix and a given set of input signals, the outputs of the switch matrix can be routed, such that in a finite period of time a method of routing is accomplished.

Figure 7A:
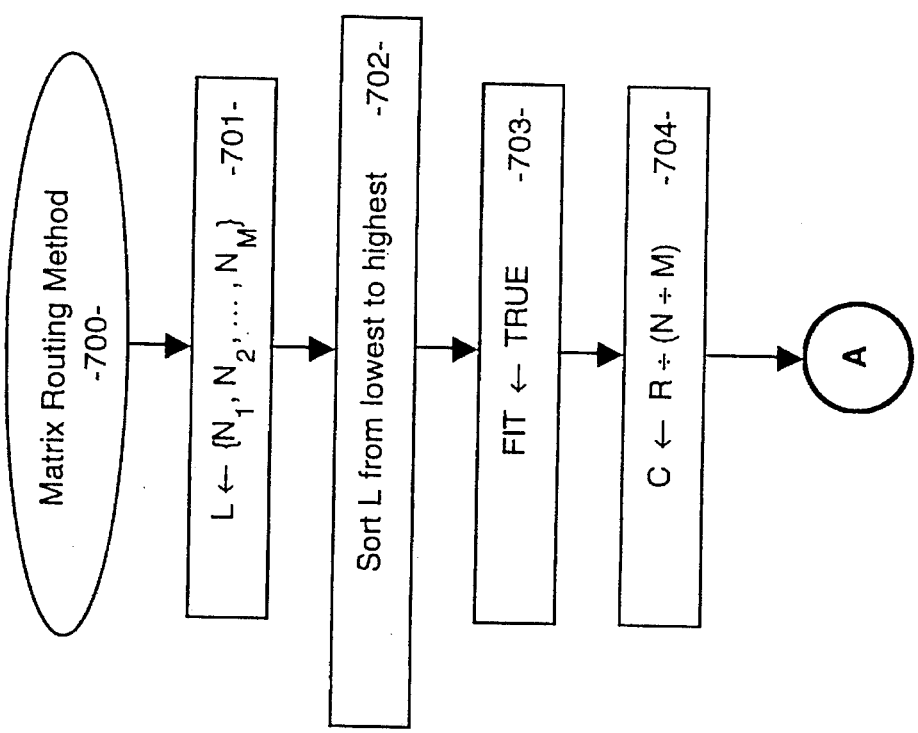
FIGS. 7A and 7B are flow charts illustrating the minimal switch routing method performed by the currently preferred embodiment of the processing logic of the present invention.

Referring to FIG. 7A, the processing logic of the currently preferred embodiment of the matrix routing method of the present invention is depicted. This logic is presented in a form of a procedure named Matrix Routing Method which can be conveniently called by the applications and systems software in order to deterministically route signals through a minimal switch matrix. It will be apparent to those skilled in the art that the processing logic of the present invention could equivalently be implemented as in-line or non-procedural logic.

When the processing logic of the matrix embodiment is initially activated using techniques well-known in the art, processing begins at processing block 700 as shown in FIG. 7A. After initializing several variables used in the process, the matrix routing procedure initially sets the set of input signals to a set variable L (processing block 701). Next, the set L is sorted from the lowest to the highest input (processing block 702). A logical variable named FIT is then set to the logical value TRUE (processing block 703). Then, the processing logic determines the number of cycles for a minimal matrix of R rows of switches, N inputs and M outputs according to the equation:

$$C = R \div (N \div M)$$

Figure 7B:
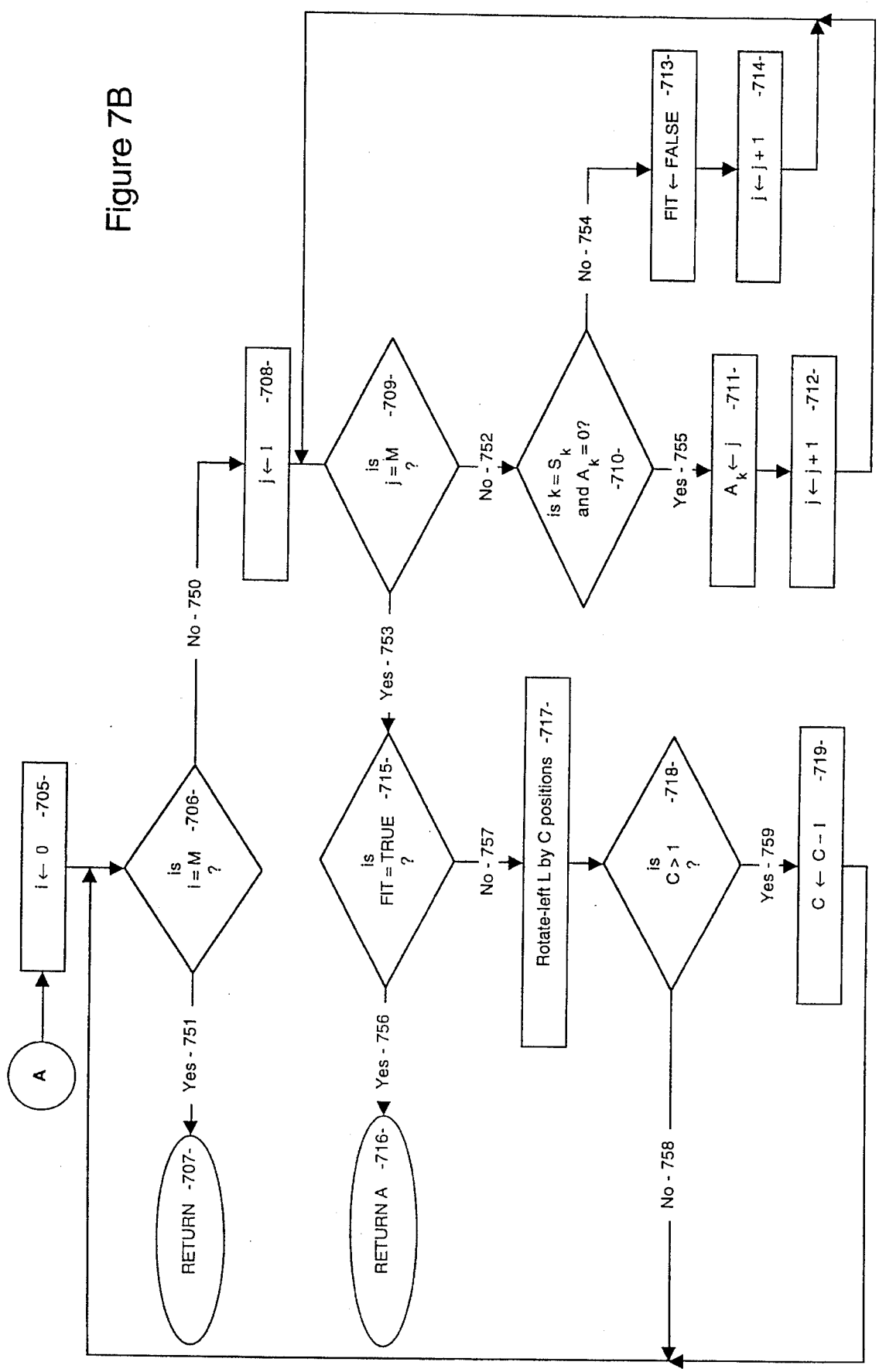

Once the number of cycles, C, has been determined, the processing continues at the bubble labeled A in FIG. 7B. Referring to FIG. 7B, a loop index variable i is initialized to the value zero (processing block 705). A loop is then started at decision block 706 where a loop termination condition is tested. If the loop index variable i becomes equal to the number of outputs M, the loop termination condition is satisfied (processing path 751) and processing terminates with the execution of a return statement (processing block 707). If the loop termination condition is not satisfied (processing path 750), the procedure drops to processing block 708. At processing block 708, another loop index variable j is initialized to a value of zero. A loop is then started at decision block 709 where a loop termination condition is tested. If the value of the loop index variable j is equal to the number of outputs M, then the condition is satisfied (processing path 753) and processing drops to decision block 715. If the condition is not satisfied (processing path 752), processing drops to decision block 710.

At decision block 710, a condition is tested. If the variable k is a column in switch matrix $S_k$ containing the input signal in the set of input signals L designated $L_j$ and the column in the connection matrix A, designated $A_k$, is not connected to another input (i.e., $A_k = 0$), the condition is satisfied. The processing logic searches the assignments of the N inputs throughout the M output columns in the switch matrix and also the second matrix $A_k$, which contains the column connections corresponding to the connections of previous input signals in set L to column locations in switch matrix S. If a column in the switch matrix contains the current input signal, designated $L_j$, and that column has not already been connected to another one of the input signals in set L, as indicated by a zero in the column location $A_k$ in the connection matrix A, then the condition is satisfied.

If the condition is satisfied, the input designated by the value of variable j is assigned the column $A_k$ in connection with matrix A for producing an output of the input signal $L_j$. Then, the loop index variable j is incremented by one (processing block 712), execution control loops back to decision block 709, and the loop processing continues until the loop termination condition is satisfied. If the condition at decision block 710 is not satisfied (processing path 754), processing drops to processing block 713 where the logical variable FIT is set to the logical value of FALSE. Then, the loop index variable j is incremented by one (processing block 714), execution control loops back to decision block 709, and a loop processing continues until the loop termination condition is satisfied.

Once the loop termination condition is satisfied, indicating that all of the input signals in set L have been filtered through the switch matrix S for output column connections (processing path 753), the processing logic determines if the value of logical variable FIT is set to the logical value TRUE (decision block 713). If the value of logical variable FIT is TRUE, the loop termination condition is satisfied (processing path 756) and the matrix routing procedure returns the column connection matrix A with the execution of a return statement (processing block 716). The satisfaction of this condition indicates that each of the input signals in set L is assigned a distinct column connection in the minimal switch matrix.

If the loop termination condition is not satisfied (processing path 757), the procedure logically rotates the set of inputs L left by the number of cycles C as determined in processing block 704 (processing block 717). Next, the processing logic tests a condition. If the number of cycles is not greater than one, then the condition is not satisfied (processing path 758), the index variable i is incremented and the logical variable FIT is set back to the logical value of TRUE (processing block 770), and execution loops back to decision block 706, and the loop processing continues until the loop termination condition of decision block 706 is satisfied. If the number of cycles is greater than one, then the condition of decision block 718 is satisfied (processing path 759) and the number of cycles is decremented by the value of one (processing block 719), the index variable i is incremented (processing block 770), and execution execution control loops back to decision block 706. The loop processing continues until the loop termination condition of the decision block 706 is satisfied. Included in the Appendix A herein is the currently preferred pseudocode for the switch matrix routing method of the present invention.

Figure 8A:
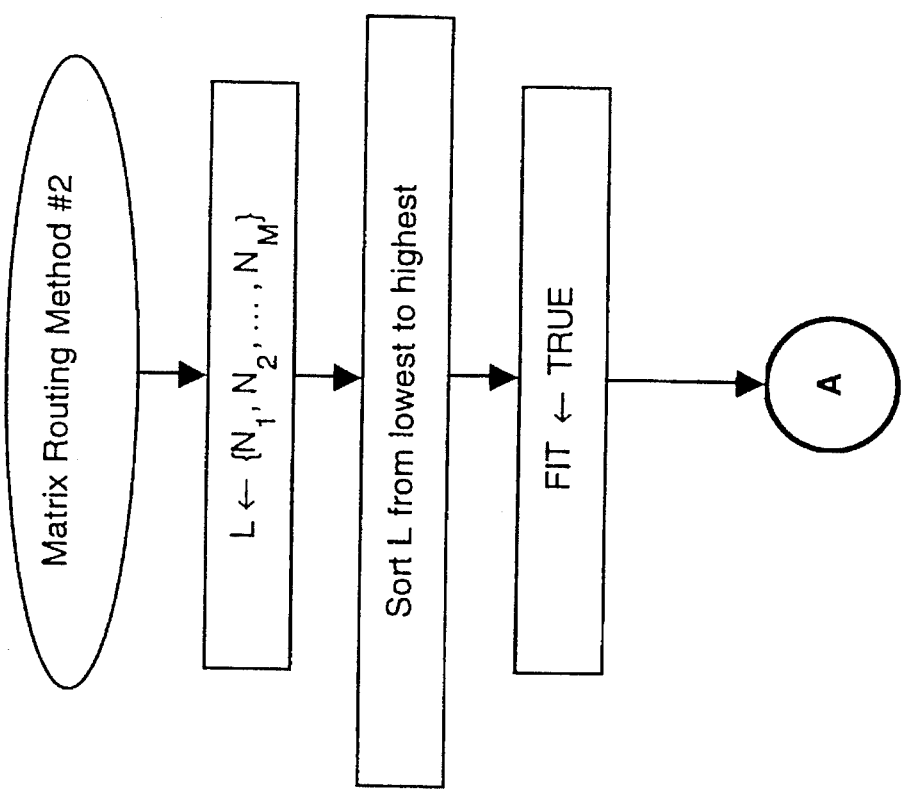
FIGS. 8A and 8B are flow charts illustrating an alternative embodiment of the minimal switch routing method performed by the processing logic of the present invention.
Figure 8B:
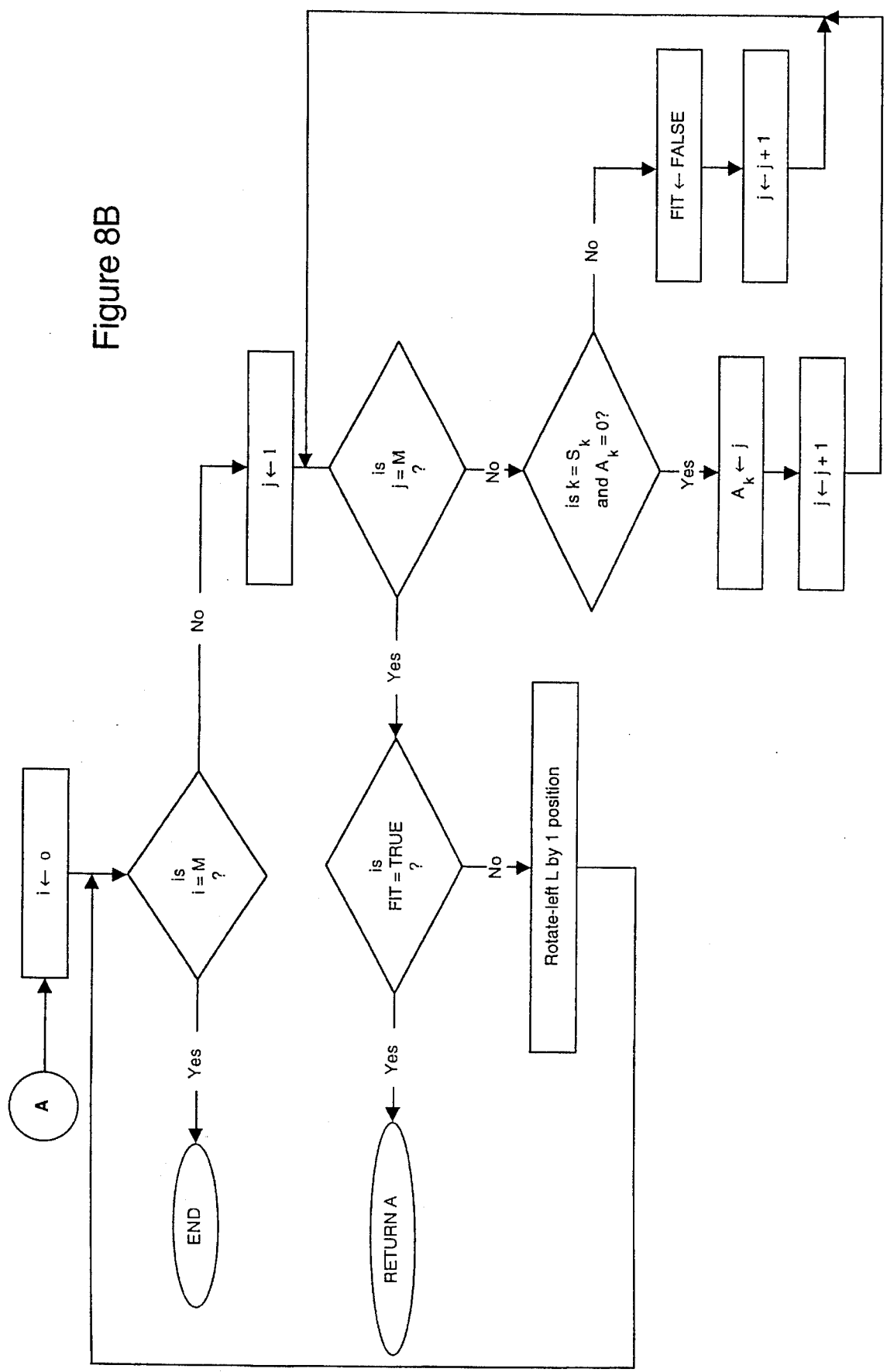

The deterministic routing method of the present invention described above routes the input signals in a minimal switch logic circuit in a finite amount of time. Specifically, M iterations are the maximum number of iterations required to determine a route for the set of input signals L since the rotations of the input set L are based on matrix cycles. A simplified embodiment of the Routing Method of the present invention fits each element in the first possible column of the minimal switch matrix and is shown in FIGS. 8A and 8B. In examining FIG. 8, in conjunction with and the same manner as parts of the processing logic of FIGS. 7A and 7B, those skilled in the art will understand the operation and scope of the simplified routing method in FIGS. 8A and 8B. Therefore, a detailed description to FIGS. 8A and 8B has been omitted. It should be noted that the notations are based on the shifting of the set of inputs, instead of shifting the set of inputs by the number of cycles. In the currently preferred embodiment of the simplified method, the input set is rotated by one position to the left. The simplified method is guaranteed to terminate the routing of the set of input signals L in a maximum of M cycles, for any set of N inputs taken M groups at a time.

A further refinement of the matrix routing method is possible. Instead of rotating the inputs in set L by the number of cycles C repeatedly, the inputs can be cycle-shifted once and then shifted by one position to the left.

The above three routing methods can be applied to the minimal switch matrices generated by the present invention as described above. For example, the 12 choose 4 matrix generated above is shown again below in Table 8 as:

TABLE 8

| 01 | 02 | 03 | 04 |
|----|----|----|----|
| 05 | 06 | 07 | 08 |
| 09 | 10 | 11 | 12 |
| 04 | 01 | 02 | 03 |
| 08 | 05 | 06 | 07 |
| 12 | 09 | 10 | 11 |
| 03 | 04 | 01 | 02 |
| 07 | 08 | 05 | 06 |
| 11 | 12 | 09 | 10 |

Given all possible inputs of 12 choose 4, the routing methods produced the following results:

The simplified method employing the shift by one, instead of cycle shifting:

| i = | routed | % routed |
|-----|--------|----------|
| 0   | 435    | 78.9%    |
| 1   | 39     | 7.9%     |
| 2   | 19     | 3.8%     |
| 3   | 2      | 0.4%     |
|     |        | 100.0%   |

The currently preferred embodiment of the routing method employing cycle shifting:

| i = | routed | % routed |
|-----|--------|----------|
| 0   | 435    | 87.9%    |
| 1   | 54     | 10.9%    |
| 2   | 6      | 1.2%     |
|     |        | 100.0%   |

The simplified method employing both cycle shifting and then shift by one:

| i = | routed | % routed |
|-----|--------|----------|
| 0   | 435    | 87.9%    |
| 1   | 54     | 10.9%    |
| 2   | 6      | 1.2%     |
|     |        | 100.0%   |

The value of the last of the three procedures is that in two sorts of the input signals in set L, ninety-nine (99) percent of all of the input signals can be routed for any matrix. However, the advantage of the last of the three procedures is gained at the expense of the merging process. Therefore, the cyclical-based shifting of the currently preferred embodiment makes it more useful. Furthermore, the currently preferred embodiment of the routing method of the present invention routes greater than 90% of the inputs in two sorts for any matrix.

The generation of the minimal switch matrices and the deterministic routing within the switch matrix of the present invention is applicable to programmable gate arrays and the routing of programmable logic arrays (PLAs). The present invention includes applications with PLAs include the generic PLA and those inside microprocessors and chip sets. Furthermore, the present invention has application in the potential of making a cross-bar switches. Moreover, the present has potential in telephone muting networks. For example, when one trunk of phone lines exists which services multiple cities is accessed and, for example, the telephone trunk has 70,000 inputs and can only choose 30,000, the present invention is directly applicable. Another application area is the field of neural-networks, where logic must be driven into a limited solution space. Also the present invention finds application in multiprocessing and routing communications between channels.

The methods of the present invention also find application in areas where 100% connectability and routability are not desired or not possible. For a matrix of N inputs and M outputs having R rows missing from the the minimal switch matrix, a certain number of output combinations cannot be taken. The present invention allows the prediction of the percent coverage given the table size (N×M) and the number of R rows missing from 100% coverage of a N–M+1 row table.

The method of the present invention generates a minimal switch circuit which receives N inputs, taken M groupings at a time. The switch circuit generated has 100% connectability and routability. When generating a switch matrix having less than 100% connectability and routability, the methods of the present invention can be employed and will generate the best possible matrix for the given number of rows.

To apply the methods of the present invention, processing logic performs exactly how it would for generating a switch matrix having 100% connectability and routability. However, once a switch matrix has been generated, any of the rows of switches in the switch matrix may be removed. The removal of rows could be due to size constraints, cost, or performance considerations. Any of the rows may be removed to arrive at the desired number of rows. The resulting matrix after the rows have been removed provides a higher percentage of coverage than any other method in the prior art.

If the number of outputs M is held constant, or given a value of R, the number of combinations that cannot be covered by the switch matrix approaches a constant as N increases. For example, if the number of rows missing is 1 (R=1) and the number of outputs M equals 2, the number of missing combinations is two whether M is 3 or 12. Thus, the following relation exists to approximate the coverage of the less than 100% connectability situation:

$$m = M \times ((R+M-1)! \div ((R-1)! \times M!))$$

where "m" is the number of missing combinations for the best possible switch matrix of M columns and R rows missing. Using the above relation, the percent not covered approaches: percent not covered= $(M \times (R+M-1)! \times (N-M)!) \div (R-1)! \times N!) \times 100\%$ Therefore, the present invention also provides the best possible switch matrix having less than 100 percent connectability and routability.

Thus, a deterministic method for minimal switch circuits has been described.

APPENDIX A

Deterministic Method for Minimal Switch Circuits

Given a sample size of N elements, taken M groups at a time, the following method generates a connection (switch) matrix which yields the minimum number of rows, R, while minimizing occurrence skew between distributions of the sample set $N_0, N_1, N_2, \ldots N_{N-1}$:

```
R ← (N − M) + 1
for j from 0 in steps of 1 to R and i from 0 do
    for k from 0 in steps of 1 to M do
        MAT_j^k ← (i mod N) + 1
        i ← i + 1
    endfor
endfor
If ~ (N mod M) then
    S ← R ÷ (N ÷ M)
    for i from 1 in steps of 1 to S + 1 do
        k ← ((N ÷ M) × i)
        If (R − k) < (N ÷ M) then
            h ← R − k
        else
            h ← N ÷ M
        endif
        for j from k in steps of 1 to (k + h) do
            for g from 0 in steps of 1 to M do
                TMAT_j^((g+i)mod M) ← MAT_j^g
            endfor
            for g from 0 in steps of 1 to M do
                MAT_j^g ← TMAT_j^g
            endfor
        endfor
    endfor
endif
```

APPENDIX A

Method for compressing an N×M switch matrix with holes to an (((N−M)+1))×M matrix format without holes.

Mark all rows in the original matrix (m) as not used yet. Set the first row in the compressed matrix (cm) to all holes.

```
n ← 0 start with row in compressed matrix (cm).
for i from 0 in steps of 1 to N do
    for j from 0 in step of 1 to M do
        Mark columns in row i that have no value (holes)
    endfor
    if all columns are holes then
        Find the next unused row (k) in the original matrix (m)
        Mark row k (m) as used.
        for j from 0 in stops of 1 to M do
            cm_{n,j} ← m_{k,j}
        endfor
    else
        for k from 0 in steps of 1 to N do
            if row k (of m) fills holes in current row (n) (of cm) and
                row k hasn't been used yet then
                Mark row k (m) as used
                for j from 0 in steps of 1 to M do
                    if cm_{n,j} is a hole then
                        cm_{n,j} ← m_{k,j}
                        cm_{n+1,j} ← hole
                    else
                        cm_{n+1,j} ← m_{k,j}
                    endif
                endfor
            endif
        endfor
        n ← n + 1
    endif
endfor
```

Where m is the original N×M matrix, cm is the compressed (N−M+1)×M matrix, and n is the number of rows in the compressed matrix.

APPENDIX A

Matrix Routing Method

The maximum number of iterations to route inputs through a switch matrix is M, if the rotations are done based on the matrix cycles R is the number of rows in the switch matrix S.

```
L = {N_1, N_2, ..., N_M}
Sort L from lowest to highest
FIT ← TRUE
C ← R ÷ (N ÷ M)
for i from 0 in steps of 1 to M do
    for j from 0 in steps of 1 to M do
        If k = S_k which contains L_j and A_k is 0
        then
            A_k ← j
        else
            FIT ← FALSE
        endif
    endfor
    If FIT = TRUE then
        return A else
    Rotate-left L by C positions
    If C > 1 then
        C ← C − 1
    endif
    endif
    FIT ← TRUE
endfor
```

This method is guaranteed to terminate in a maximum of M cycles, for any set of N inputs taken M groups at a time.

APPENDIX A

Matrix Routing Method #2

Given a switch matrix S, and a sample of N elements, taken M groups at a time, generate a routing of the elements through S.

The simplest method, is to use a first fit approach. For each element, find the first unused column in S that will the element can connect to.

```
L = {N_1, N_2, ..., N_M}
Sort L from lowest to highest
FIT ← TRUE
for i from 0 in step& of 1 to M do
    for j from 0 in steps of 1 to M do
        If k = S_k which contains L_j and A_k is 0
        then
            A_k ← j
        else
            FIT ← FALSE
        endif
    endfor
    If FIT = TRUE then
        return A else
    Rotate-left L by 1 position
    endif
    FIT ← TRUE
endfor
```

This method is guaranteed to terminate in a maximum of M cycles, for any set of the N inputs taken M groups at a time.

We claim:

1. In a computer system having processing logic and at least one memory, a computer controlled method of generating a switch matrix given a sample size of N number of inputs taken M number of outputs at a time, wherein N and M are positive integers, said switch matrix taking said M number of outputs independent of order, said computer controlled method comprising the steps of:

sizing said switch matrix using said processing logic such that said switch matrix has a plurality of rows of switches and M output columns, said plurality of rows being less in number than the sample size of N number of inputs, wherein each one of said switches in said plurality of rows is coupled to an individual one of said M output columns and each row has M switches; and coupling said N inputs to M output columns using said switches in said rows, such that said switch matrix outputs M number of outputs in response to each possible combination of M number of inputs.

2. The method defined in claim 1 wherein said step of sizing includes the step of determining said plurality of rows according to the equation $((N-M)+1)$.

3. The method defined in claim 1 wherein said step of coupling includes the step of distributing said N number of inputs to said switches in said plurality of rows, such that said N number of inputs are as evenly loaded as possible within said matrix with respect to one another.

4. In a computer system having processing logic and at least one memory, a computer controlled method of generating a switch matrix having a sample size of N number of inputs taken M number of outputs at a time, wherein N and M are positive integers, said M number of inputs taken independent of order, said computer controlled method comprising the steps of:

determining a number of rows in said switch matrix using said processing logic according to the equation $((N-M)+1)$, each of said rows having M number of switches;

coupling a plurality of output columns to said plurality of switches, said matrix having M output columns, wherein each of said M output columns is coupled to each of said rows in said matrix at a separate one of said M number of switches; and distributing said N number of inputs to said switches in said number of rows, wherein each of said N number of inputs is distributed and coupled to a first quantity of switches or to a second quantity of switches, wherein said first quantity is one fewer than said second quantity, such that said N number of inputs are evenly loaded throughout said matrix.

5. In a computer system having processing logic and at least one memory, a computer controlled method of generating a connection matrix given a sample size of N number of inputs taken M number of outputs at a time, each of said outputs coupled to one of M columns, wherein N and M are positive integers, said connection matrix grouping said M number of outputs independent of order, said computer controlled method comprising the steps of:

determining using said processing logic the minimum plurality of rows of switches necessary to produce all possible combinations of said M number of outputs, each of said switches in said rows being coupled to one of said M columns; and distributing each of said N number of inputs among said switches in said connection matrix, wherein each of said N number of inputs is distributed and coupled to a first quantity of switches or to a second quantity of switches, wherein said first quantity is one fewer than said second quantity, such that said N number of inputs are evenly loaded throughout said matrix, and wherein said connection matrix outputs M number of outputs in response to each possible combination of said M number of inputs.

6. The method defined in claim 5 wherein said step of determining comprises calculating said minimum number of rows according to the equation $((N-M)+1)$.

7. The method defined in claim 5 wherein if said N number of inputs is evenly divisible by said M number of outputs, said method further comprises the step of redistributing each subsequent cycle of N number of inputs, such that said matrix outputs all possible combinations of M number of inputs.

8. In a computer system having processing logic and at least one memory, a computer controlled method of generating a switch matrix having N number of inputs and outputting M number of outputs, each of said M outputs corresponding to a column in said matrix, said switch matrix grouping the M number of outputs independent of order, said computer controlled method comprising the steps of:

determining using said processing logic the R number of rows of switches required for said switch matrix to output all possible combinations of M number of inputs, said R number of rows equal to $((N-M)+1)$, each of said plurality of rows having M number of switches, wherein each of said columns is coupled to each of said plurality of rows at a separate switch on said each of said plurality of rows, such that said switch matrix is an R×M matrix;

distributing each One of the N number of inputs to a separate one of said switches in said switch matrix by assigning and coupling each of the N number of inputs in an order to a separate one of said switches and repeatedly assigning and coupling each of said N number to separate switches in the order until all of said switches are assigned an input.

9. The method defined in claim 8 wherein if said M number is evenly divisible by said N number, each subsequent cycle of N number of inputs is column shifted, such that each N inputs in the cycle assigned to switches in one of said rows is shifted to another one of said switches in said one row, such that said switch matrix outputs M number of outputs in response to each possible combination of M number of inputs.

10. The method defined in claim 9 wherein the number of cycles, S, to distribute the N number of inputs within said matrix of R rows by M columns is given by:

$$S = R/(N/M).$$

11. In a computer system having processing logic and at least one memory, a computer controlled method of generating a switch matrix having N number of inputs and producing M number of outputs, each of said M outputs corresponding to a column in said matrix, said switch matrix grouping the M number of outputs independent of order, said computer controlled method comprising:

determining using said processing logic a minimum number of rows necessary to produce said M number of outputs, each of said minimum number of rows having an M number of switches, such that each of said M outputs is coupled to each of said minimum number of rows at a separate one of said M number of switches;

distributing the N number of inputs to said switches by cycling the inputs through said matrix, wherein said cycling steps includes, assigning and coupling each of the N number of inputs in an order to a separate one of said switches and repeatedly assigning and coupling each of said N number to separate switches in the order until all of said switches are assigned an input; and determining using said processing logic whether said matrix outputs M number of outputs for all possible combinations of M number of inputs, such that if said switch matrix does not produce M number of outputs in response to all possible combinations of M number of inputs then said method includes, a step of shifting each cycle of inputs until said switch matrix produces M number of outputs in response to each possible combinations of M number of inputs.

12. The method defined in claim 11 wherein the minimum number of rows is determined according to the equation ((N−M)+1).

13. The method defined in claim 11 wherein said step of determining whether said switch matrix outputs all possible combinations comprises the step of determining whether the number of inputs N is evenly divisible by the number of outputs M.

14. In a computer system having processing logic and at least one memory, a computer controlled method of generating a switch matrix having N number of inputs and producing M number of outputs, each of said M outputs corresponding to a column in said matrix, said switch matrix grouping the M number of outputs independent of order, said computer controlled method comprising:

determining using said processing logic a minimum number of rows necessary to produce said M number of outputs, each of said minimum number of rows having an M number of switches, such that each of said M outputs is coupled to each of said minimum number of rows at a separate one of said M number of switches;

distributing using said processing logic the N number of inputs to said switches by,
a) assigning each of said switches in one of said rows a distinct input from said N number of inputs,
b) repeating step (a) for the next of said rows in said matrix using those of said N number of inputs not previously used,
c) repeating step (b) until all of said N number of inputs has been assigned, and
if all of said N number of inputs have been assigned then continue assigning each of said remaining switches in said matrix one of said N inputs in the same order as said N inputs were assigned in steps (a) and (b) on a row by row basis wherein all of said switches are assigned one of said N number of inputs, such that said N number of inputs are within one input of being evenly distributed within said matrix with respect to any of the other of said N number of inputs; and determining using said processing logic whether said matrix outputs M number of outputs in response to each possible combination of M number of inputs, such that if said switch matrix does not produce M number of outputs for all possible combinations of M number of inputs then said method includes, a step of shifting each cycle of inputs until said switch matrix produces M number of outputs in response to each possible combination of M number of inputs.

15. The method defined in claim 11 or claim 14 wherein the step of shifting comprises the steps of:
determining a number of cycles of said N number of inputs are in said switch matrix;
shifting each of the cycles in a predetermined number of switch positions, such that each subsequent cycle is shifted said predetermined number of switch positions more than the previous cycle.

16. The method defined in claim 15 wherein a first cycle of N number of inputs is not shifted.

17. The method defined in claim 15 wherein said cycles in said matrix are shifted one position.

18. In a computer system having processing logic and at least one memory, a computer controlled method of generating a switch matrix having switches, N number of inputs, and producing M number of outputs, each of said M outputs corresponding to a column in said matrix, said switch matrix grouping the M number of outputs independent of order, said computer controlled method comprising:

defining a plurality of rows using said processing logic, wherein each of said plurality of rows has an M number of switches;

cycling N number of inputs to said switches in said matrix by assigning each of the N number of inputs in an order to a separate one of said switches and repeatedly assigning each of said N number to separate switches in the order until all of said switches are assigned an input such that a switch matrix assignment is generated;

determining using said processing logic whether each of said N number of inputs is assigned to said switches in a same column, and if so, modifying the switch matrix assignment by,
identifying a first set of N number of inputs wherein one of said first set is assigned in the same column as one of a previous set of N number of inputs,
identifying a set of rows of said plurality of rows in which said first N number of inputs set reside, and
reassigning each of said first N number of inputs set by rotating one column position assignments made for each row of said set of rows thereby modifying the switch matrix assignment; and coupling said switch matrix assignment to said switches of said switch matrix.

19. In a computer system having processing logic and at least one memory, a computer controlled method for generating a switch matrix having N number of inputs and producing M number of outputs, each of said M outputs corresponding to a column in said matrix, said switch matrix grouping M number of inputs independent of order, said computer controlled method comprising the steps of:

sizing said matrix using said processing logic such that said switch matrix has R number of rows of switches and M number of outputs, wherein R and M are positive integers and R is equal to the quantity ((N−M)+1), and further wherein each of said switches in said R number of rows are coupled to said M output columns;

distributing each of said N number of inputs among said switches in said switch matrix, wherein each of said N number of inputs is connected to a first quantity of switches or to a second quantity of switches, wherein said first quantity is one fewer than said second quantity, such that said N number of inputs are evenly loaded throughout said matrix, such that said switch matrix outputs M number of outputs for each possible combination of said M number of inputs; and eliminating rows in said matrix, such that said switch matrix does not output M number of outputs for all possible combinations of M inputs.

20. An apparatus comprising: a bus; a processor coupled to said bus; a storage device coupled to said bus, containing a set of instructions for generating a switch matrix given a sample size of N number of inputs taken M number of outputs at a time, wherein N and M are positive integers, said matrix taking said M groups independent of order;

means for sizing said matrix such that said switch matrix has a plurality of rows of switches and M output columns, said plurality of rows being less in number than the number of N inputs, wherein each of said switches in said plurality of rows are coupled to said M output columns; and means for coupling said N inputs to M output columns using said switches in said rows, such that said switch matrix outputs M number of outputs for each possible combination of M number of inputs.

21. An apparatus for generating a switch matrix having a sample size of N number of inputs taken M number of outputs at a time, wherein N and M are positive integers, said M number of outputs taken independent of order said apparatus comprising:

a bus:

a processor coupled to said bus:

a storage device coupled to said bus, containing a set of instructions:

means for determining a number of rows in said matrix according to the equation ((N−M)+1), each of said rows having M number of switches;

means for coupling a plurality of output columns to said plurality of switches, said matrix having M output columns, wherein each of said M output columns is coupled to each of said rows in said matrix at a separate one of said M number of switches; and means for distributing said N number of inputs to said switches in said ((N−M)+1) rows, wherein each of said N number of inputs is connected to a first quantity of switches or to a second quantity of switches, wherein said first quantity is one fewer than said second quantity, such that said N number of inputs are evenly loaded throughout said switch matrix.

22. An apparatus comprising: a bus; a processor coupled to said bus; a storage device coupled to said bus, containing a set of instructions for generating a connection matrix given a sample size of N number of inputs taken M number of outputs at a time, each of said outputs coupled to one of M columns, wherein N and M are positive integers, said switch matrix grouping said M number of outputs independent of order;

means for determining a minimum plurality of rows of switches necessary to produce said M number of outputs, each of said switches in said rows being coupled to one of said M columns; and means for distributing each of said N number of inputs among said switches in said switch matrix, wherein each of said N number of inputs is connected to a first quantity of switches or to a second quantity of switches, wherein said first quantity is one fewer than said second quantity, such that said N number of inputs are evenly loaded throughout said matrix, wherein said switch matrix outputs M number of outputs for each possible combination of said M number of inputs.

23. An apparatus comprising: a bus; a processor coupled to said bus; a storage device coupled to said bus, containing a set of instructions for generating a switch matrix having switches, N number of inputs, and producing M number of outputs, each of said M outputs corresponding to a column in said matrix, said switch matrix grouping the M number of outputs independent of order;

means for determining a minimum number of rows necessary to produce said M number of outputs, each of said minimum number of rows having an M number of switches;

means for distributing the N number of inputs to said switches by assigning each of the N number of inputs in an order to a separate one of said switches and repeatedly assigning each of said N number of inputs to separate switches until all of said switches are assigned to an input;

means for coupling each switch to an appropriately assigned input; and means for determining whether said matrix outputs M number of outputs for each possible combinations of M number of inputs, such that if said matrix does not produce M number of outputs for all possible combinations of M number of inputs then said apparatus includes a means for shifting each cycle of inputs until said matrix outputs M number of outputs for each possible combination of M number of inputs.

24. The apparatus defined in claim 23 wherein the minimum number of rows is determined according to the equation ((N−M)+1).

25. The apparatus defined in claim 23 wherein said means for determining whether said matrix outputs all possible combinations comprises the means for determining whether the number of inputs N is evenly divisible by the number of outputs M.

26. An apparatus comprising: a bus; a processor coupled to said bus; a storage device coupled to said bus, containing a set of instructions for generating a switch matrix having N number of inputs and producing M number of outputs, each of said M outputs corresponding to a column in said matrix, said switch matrix grouping the M number of outputs independent of order;

means for determining a minimum number of rows necessary to produce said M number of outputs, each of said minimum number of rows having an M number of switches;

means for distributing each one of the N number of inputs to a separate one of said switches in said switch matrix by,
  a) means for assigning each of said switches in one of said rows a distinct input from said N number of inputs;
  b) means for repeating step (a) for the next of said rows in said matrix using those of said N number of inputs not previously used;
  c) means for repeating step (b) until all of said N number of inputs has been assigned, and
  if all of said N number of inputs have been assigned then continue assigning each of said remaining switches in said matrix one of said N inputs in the same order as said N inputs were assigned in steps (a) and (b) on a row by row basis wherein all of said switches are assigned one of said N number of inputs, such that said N number of inputs are within one input of being evenly distributed within said matrix with respect to any of the other of said N number of inputs;

means for coupling each switch to an appropriately assigned input; and means for determining whether said matrix outputs M number of outputs for each possible combination of M number of inputs, such that if said matrix does not produce M number of outputs for all possible combinations of M number of inputs then said apparatus includes a means for shifting each cycle of inputs until said matrix outputs M number of outputs for all possible combinations of M number of inputs.

27. The apparatus defined in claim 23 or claim 26 wherein the means for shifting comprises:

means for determining the number of cycles of said N number of inputs are in said switch matrix; and means for shifting each of the cycles in a predetermined number of switch positions, such that each subsequent cycle is shifted said predetermined number of switch positions more than the previous cycle.

28. The apparatus defined in claim 27 wherein a first cycle of N number of inputs is not shifted.

29. The apparatus defined in claim 27 wherein said cycles in said matrix are shifted one position.

30. An apparatus comprising: a bus; a processor coupled to said bus; a storage device coupled to said bus, containing a set of instructions for generating a switch matrix having N number of inputs and producing M number of outputs, each of said M outputs corresponding to a column in said matrix, said switch matrix grouping the M number of outputs independent of order;

means for determining a minimum plurality of rows necessary to produce said M number of outputs, each of said plurality of rows having an M number of switches;

means for cycling N number of inputs to said switches in said matrix, wherein said means for cycling includes means for assigning and coupling each of the N number of inputs in an order to separate one of said switches and repeatedly assigning and coupling each of said N number to separate switches in the order until all of said switches are assigned an input; and means for determining whether each of said N number of inputs is assigned to said switches in the same column, such that said matrix does not produce M number of outputs in response to each possible combination of M number of inputs then said method includes a step of shifting each cycle of N inputs one column position from the column position of the previous cycle.

31. In a computer system having processing logic and at least one memory, a computer controlled method of generating a R×M switch matrix having switches, N inputs, and M outputs from a preliminary set of R×M switch assignments, wherein R and M are a number of rows and columns respectively, and further wherein R, N and M are positive integers and R is less than N, said computer controlled method comprising the steps of:

generating using processing logic an intermediate matrix of N×M switch assignments having M columns and N rows with each of said N rows corresponding to an individual one of said N inputs, said intermediate matrix generated by marking each column location of each of said N rows with either a marker identical to said individual one if said individual one resides in any row of an individually associated column of said preliminary set of R×M switch assignments, or with an empty marker if said individual one does not reside in any row of said individually associated column of said preliminary set of R×M switch assignments;

compressing using processing logic said intermediate matrix of N×M switch assignments to generate a new matrix of R×M switch assignments by identifying using processing logic each empty marker in said intermediate matrix, and for each identified empty marker moving switch assignments up one row for a partial column segment, said partial column segment being all of a column below said empty marker thereby eliminating all empty markers in said new matrix of R×M switch assignments; and coupling said new matrix of R×M switch assignments to said switches of said R×M switch matrix.

* * * * *

UNITED STATES PATENT AND TRADEMARK OFFICE
CERTIFICATE OF CORRECTION

PATENT NO. : 5,530,439
DATED : June 25, 1996
INVENTOR(S) : Steele et al.

It is certified that error appears in the above-identified patent and that said Letters Patent is hereby corrected as shown below:

In column 8 at line 32 insert --470)-- following block and prior to "followed"

In column 20 at line 5 delete "muting" and insert --routing--

Signed and Sealed this

Twenty-fourth Day of June, 1997

Attest:

BRUCE LEHMAN

*Attesting Officer*  *Commissioner of Patents and Trademarks*